US010665769B2

(12) United States Patent
Caudillo et al.

(10) Patent No.: US 10,665,769 B2
(45) Date of Patent: May 26, 2020

(54) QUANTUM CIRCUIT ASSEMBLIES WITH VERTICALLY-STACKED PARALLEL-PLATE CAPACITORS

(71) Applicant: Intel Corporation, Santa Clara, CA (US)

(72) Inventors: Roman Caudillo, Portland, OR (US); Zachary R. Yoscovits, Beaverton, OR (US); Lester Lampert, Portland, OR (US); David J. Michalak, Portland, OR (US); Jeanette M. Roberts, North Plains, OR (US); Ravi Pillarisetty, Portland, OR (US); Hubert C. George, Portland, OR (US); Nicole K. Thomas, Portland, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/011,829

(22) Filed: Jun. 19, 2018

(65) Prior Publication Data

US 2019/0044046 A1    Feb. 7, 2019

(51) Int. Cl.
*H01L 39/02* (2006.01)
*H01L 27/18* (2006.01)
(Continued)

(52) U.S. Cl.
CPC .......... *H01L 39/025* (2013.01); *G06N 10/00* (2019.01); *H01L 27/18* (2013.01); *H01L 39/045* (2013.01);
(Continued)

(58) Field of Classification Search
None
See application file for complete search history.

(56) References Cited

U.S. PATENT DOCUMENTS 4,498,228 A  *  2/1985  Jillie, Jr. .............. H01L 39/2493
                                                      216/3
9,503,063 B1 * 11/2016  Abraham ................. H03K 3/38
(Continued)

OTHER PUBLICATIONS

Wendin, G. "Quantum Information Processing with Superconducting Circuits: a Review." Reports on Progress in Physics, vol. 80, No. 10, 2017, p. 106001., doi:10.1088/1361-6633/aa7e1a. (Year: 2017).*
(Continued)

*Primary Examiner* — J. E. Schoenholtz
(74) *Attorney, Agent, or Firm* — Patnet Capital Group

(57) ABSTRACT

Various embodiments of the present disclosure present quantum circuit assemblies implementing vertically-stacked parallel-plate capacitors. Such capacitors include first and second capacitor plates which are parallel to one another and separated from one another by a gap measured along a direction perpendicular to the qubit plane, i.e. measured vertically. Fabrication techniques for manufacturing such capacitors are also disclosed. Vertically-stacked parallel-plate capacitors may help increasing coherence times of qubits, facilitate use of three-dimensional and stacked designs for quantum circuit assemblies, and may be particularly advantageous for realizing device scalability and use of 300-millimeter fabrication processes.

24 Claims, 10 Drawing Sheets

(51) Int. Cl.
  H01L 39/24    (2006.01)
  H01L 39/04    (2006.01)
  G06N 10/00    (2019.01)
  H01L 39/22    (2006.01)
(52) U.S. Cl.
  CPC ........ *H01L 39/2493* (2013.01); *H01L 39/223* (2013.01)

(56) References Cited

U.S. PATENT DOCUMENTS

| | | | |
|---|---|---|---|
| 9,836,699 B1* | 12/2017 | Rigetti | H01L 39/223 |
| 2002/0190381 A1* | 12/2002 | Herr | H01L 27/18 257/758 |
| 2013/0264617 A1 | 10/2013 | Joshi et al. | |
| 2014/0235450 A1* | 8/2014 | Chow | H01L 39/00 505/170 |
| 2016/0148112 A1* | 5/2016 | Kwon | H01L 27/18 257/31 |
| 2018/0232653 A1* | 8/2018 | Selvanayagam | H01P 5/028 |
| 2019/0165240 A1* | 5/2019 | Brink | H01L 39/025 |

OTHER PUBLICATIONS

"Independent, extensible control of same-frequency superconducting qubits by selective broadcasting," Asaad et al., Netherlands Organisation for Applied Scientific Research, Aug. 28, 2015, 17 pages.

"Multilayer microwave integrated quantum circuits for scalable quantum computing," Brecht et al, Department of Applied Physics, Yale University, Sep. 4, 2015, 5 pages.

"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.

"Surface loss simulations of superconducting coplanar waveguide resonators," Wenner et al, Applied Physics Letters 99, 113513 (2011), pp. 113513-1 through 3.

"Magnetic field tuning of coplanar waveguide resonators," Healey, et al., Applied Physics Letters 93, 043513 (2008), pp. 043513-1 through 3 (4 pages with cover sheet).

"Embracing the quantum limit in silicon computing," Morton et al, Macmillan Publishers, Nov. 17, 2011, vol. 479, Nature, pp. 345-353.

"Scalable quantum circuit and control for a superconducting surface code," Versluis et al, Netherlands Organisation for Applied Scientific Research, Dec. 28, 2016, 9 pages.

"Suspending superconducting qubits by silicon micromachining," Chu et al., Department of Applied Physics, Yale University, Jun. 10, 2016, 10 pages.

"High Coherence Plane Breaking Packaging for Superconducting Qubits," Bronn, et al., IBM R.J. Watson Research Center, National Institute of Standards and Technology; Sep. 7, 2017, 9 pages.

"Parametrically Activated Entangling Gates Using Transmon Qubits," Caldwell, et al., Rigetti Computing, Berkley, CA; Jun. 20, 2017, 6 pages.

"Experimental demonstration of fault-tolerant state preparation with superconducting qubits," Takita, et al., IBM T.J. Watson Research Center, May 25, 2017; 11 pages.

"A blueprint for demonstrating quantum supremacy with superconducting qubits," Neill, et al., Department of Physics, University of California, Google Inc., NASA Ames Research Center; Sep. 19, 2017, 22 pages.

"Deterministic quantum teleportation with feed-forward in a solid state system," Steffen, et al., Nature 500, Aug. 15, 2013, pp. 319-322.

"Quantum Teleportation and Efficient Process Verification with Superconducting Circuits," Steffen, Lars, Doctoral Thesis submitted to ETH Zurich, 2013; 6 pages.

* cited by examiner

US 10,665,769 B2

QUANTUM CIRCUIT ASSEMBLIES WITH VERTICALLY-STACKED PARALLEL-PLATE CAPACITORS

TECHNICAL FIELD

This disclosure relates generally to the field of quantum computing, and more specifically, to capacitors used in quantum circuit assemblies, and to methods of fabrication thereof.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum-mechanical phenomenon. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled.

Designing and manufacturing quantum circuits is a non-trivial task because the unique quantum mechanical phenomena in such circuits lead to unique considerations which never had to be dealt with in classical, non-quantum, circuits, such as e.g. taking precautions in protecting qubits from decoherence so that they can stay in their information-holding states long enough to perform the necessary calculations and read out the results, and ability to operate at cryogenic temperatures. That is why, compared to well-established and thoroughly researched classical computers, quantum computing is still in its infancy, with the highest number of qubits in a solid-state quantum processor currently being below 100 and with the current manufacturing approaches being far from those which could be used in large-scale manufacturing. As the applications needing quantum circuits grow, the need for quantum circuit assemblies having improved performance and manufactured using existing process tools of leading-edge device manufacturers also grows.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
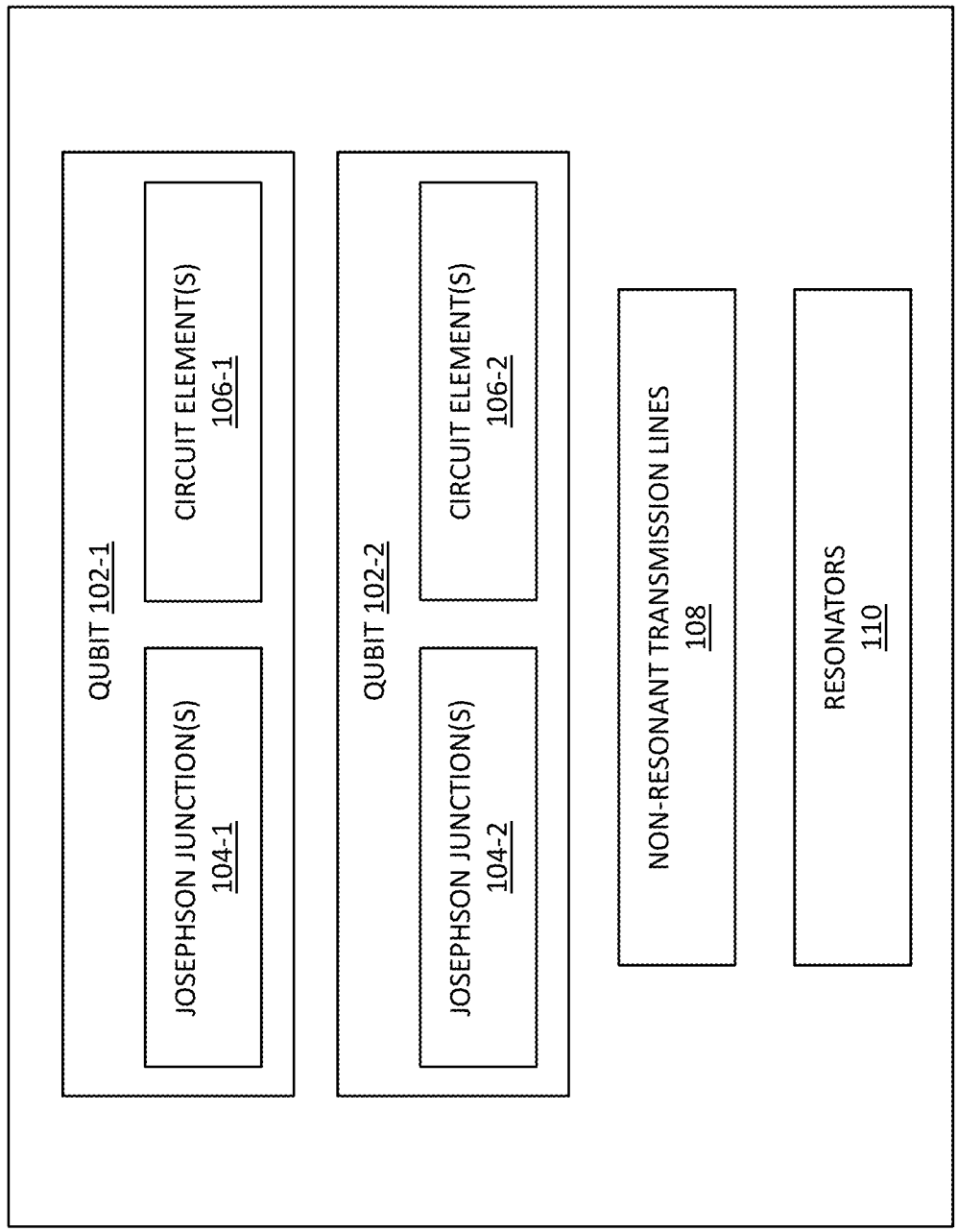
FIG. 1 provides a schematic illustration of a quantum circuit assembly that may include one or more vertically-stacked parallel-plate capacitors, according to one embodiment of the present disclosure.

As briefly described above, quantum computing, or quantum information processing, refers to the field of research related to computation systems that use quantum-mechanical phenomena to store and manipulate data. One example of quantum-mechanical phenomena is the principle of quantum superposition, which asserts that any two or more quantum states can be added together, i.e. superposed, to produce another valid quantum state, and that any quantum state can be represented as a sum of two or more other distinct states. Quantum entanglement is another example of quantum-mechanical phenomena. Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits may be represented by a superposition of $2^N$ quantum states. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e. by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e. computers that use phenomena of classical physics). Therefore, both industry and academia continue to focus on a search for new and improved physical systems whose functionality could approach that expected of theoretically designed qubits. Physical systems for implementing qubits that have been explored until now include e.g. superconducting qubits (e.g. flux qubits or transmon qubits or simply "transmons"), semiconducting qubits including those made using quantum dots (e.g., spin qubits and charge qubits), photon polarization qubits, single trapped ion qubits, etc.

A capacitor is one fundamental type of component used in quantum circuits based on various physical systems for implementing qubits. For example, capacitors may be used to couple different qubits to one another or to couple various portions of a single qubit. Conventionally, capacitors in quantum circuit assemblies are implemented with both of their capacitor plates being provided in a single plane, typically in the same plane in which the rest of quantum circuit components are provided (i.e. in the qubit plane), with the gap between the capacitor plates extending in the plane of the capacitor plates. Such implementation is similar to a coplanar waveguide (CPW) architecture often used to implement various microwave transmission lines and resonators of quantum circuits.

Inventors of the present disclosure realized that, when used in quantum circuits, employing a capacitor architecture with both capacitor plates being provided in a single plane parallel to, or being in, the qubit plane may have various drawbacks. Various embodiments of the present disclosure present quantum circuit assemblies implementing vertically-stacked parallel-plate capacitors. Such capacitors include first and second capacitor plates which are parallel to one another (hence, capacitors are "parallel-plate") and separated from one another by a gap measured along a direction perpendicular to the qubit plane, i.e. along the vertical direction (hence, capacitor plates are "vertically-stacked"). An exemplary quantum circuit assembly may include a substrate and a qubit device provided over or at least partially in the substrate (i.e. the substrate is a "qubit substrate" or a "qubit die"). The qubit device may implement a capacitor that includes a first capacitor plate provided in a first plane and a second capacitor plate provided in a second plane, where the second plane being substantially parallel to and separated from the first plane by a gap, and being farther away from the substrate than the first plane. Both capacitor plates may be parallel to the substrate. Such a capacitor is a "parallel-plate capacitor" because capacitor plates/electrodes lie in parallel planes separated by a gap, and is "vertically-stacked" because the second capacitor plate has at least a portion that is stacked in a plane farther away from the substrate than the first capacitor plate. In other words, the capacitor plates may be both parallel to the substrate and may be vertically stacked over one another so that there is a bottom capacitor plate, a gap, and a top capacitor plate. Fabrication techniques for manufacturing such capacitors are also disclosed.

In general, as used in the art, the terms "capacitor electrodes" and "capacitor plates" are often used interchangeably. However, the term "capacitor electrodes" may be used to also include electrical connections to the parallel capacitor plates. In context of the present disclosure, describing one (e.g. a first) capacitor plate as being parallel to another (e.g. a second) capacitor plate does not exclude that a capacitor electrode that includes the first capacitor plate further has one or more portions which are not parallel to the second capacitor plate, and/or that a capacitor electrode that includes the second capacitor plate further has one or more portions which are not parallel to the first capacitor plate. In various embodiments, the gap between first and second capacitor plates as described herein may refer to a separation or an opening between two planar conductors, typically superconductors, implementing the first and second capacitor plates, which opening may include air, some other gas or combination of gasses, may be filled with a liquid or a solid dielectric material, or may be a substantially vacuum opening.

Quantum circuit assemblies implementing vertically-stacked parallel-plate capacitors as described herein may provide significant advantages in terms of e.g. reducing losses and increasing coherence times of qubit devices. For example, losses which lead to qubit decoherence may be reduced due to the gap between the two capacitor plates being moved further away from the potentially lossy material of the substrate, compared to conventional implementations. In particular, such a gap may allow reducing spurious (i.e. unintentional and undesirable) two-level systems (TLSs), thought to be a dominant source of qubit decoherence, where, in general, as used in quantum mechanics, a two-level (also referred to as "two-state") system is a system that can exist in any quantum superposition of two independent and physically distinguishable quantum states. Furthermore, implementing vertically-stacked parallel-plate capacitors as described herein may advantageously facilitate use of three-dimensional (3D) and stacked designs for quantum circuit assemblies and may be particularly advantageous for realizing device scalability and use of 300-millimeter fabrication processes. In general, vertically-stacked parallel-plate capacitors as described herein could be used in quantum circuit assemblies for coupling different qubits to one another, or/and coupling different portions of a single qubit to one another (e.g. if used to implement shunt capacitors of transmon qubits).

In order to provide substantially lossless connectivity to, from, and between the qubits, some or all of the electrically conductive portions of quantum circuit assemblies described herein, in particular various capacitor electrodes/plates described herein, as well as other components of quantum circuits, may be made from one or more superconducting materials. However, some or all of these electrically conductive portions could be made from electrically conductive materials which are not superconducting. In the following, unless specified otherwise, reference to an electrically conductive material implies that a superconducting material can be used, and vice versa. Furthermore, materials described herein as "superconducting materials" may refer to materials, including alloys of materials, that exhibit superconducting behavior at typical qubit operating conditions (e.g. materials which exhibit superconducting behavior at very low temperatures at which qubits typically operate), but which may or may not exhibit such behavior at higher temperatures (e.g. at room temperatures). Examples of such materials include aluminum (Al), niobium (Nb), niobium nitride (NbN), titanium nitride (TiN), niobium titanium nitride (NbTiN), indium (In), and molybdenum rhenium (MoRe), all of which are particular types of superconductors at qubit operating temperatures, as well as their alloys.

While some descriptions are provided with reference to superconducting qubits, in particular to transmons, a particular class of superconducting qubits, at least some teachings of the present disclosure may be applicable to quantum circuit assembly implementations of any qubits, including superconducting qubits other than transmons and/or including qubits other than superconducting qubits, which may employ vertically-stacked parallel-plate capacitors as described herein, all of which implementations are within the scope of the present disclosure. For example, any of the vertically-stacked parallel-plate capacitors described herein may be used in hybrid semiconducting-superconducting quantum circuit assemblies or any other quantum technology with quantum circuit elements that are capacitively coupled to on another.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of exemplary structures of various devices and assemblies described herein may be shown with precise right angles and straight lines, but it is to be understood that such schematic illustrations may not reflect real-life process limitations which may cause the features to not look so "ideal" when any of the structures described herein are examined using e.g. scanning electron microscopy (SEM) images or transmission electron microscope (TEM) images. In such images of real structures, possible processing defects could also be visible, such as e.g. not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−5-20% of a target value based on the context of a particular value as described herein or as known in the art. Similarly, terms indicating orientation of various elements, such as e.g. "coplanar," "perpendicular," "orthogonal," "parallel," or any other angle between the elements, generally refer to being within +/−5-20% of a target value based on the context of a particular value as described herein or as known in the art.

Furthermore, as used herein, terms indicating what may be considered an idealized behavior, such as e.g. "lossless" (or "low-loss") or "superconducting," are intended to cover functionality that may not be exactly ideal but is within acceptable margins for a given application. For example, a certain level of loss, either in terms of non-zero electrical resistance or non-zero amount of spurious TLS's may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

Still further, while the present disclosure may include references to microwave signals, this is done only because current qubits are designed to work with such signals because the energy in the microwave range is higher than thermal excitations at the temperature that qubits are typically operated at. In addition, techniques for the control and measurement of microwaves are well known. For these reasons, typical frequencies of qubits are in 1-30 GHz, e.g. in 3-10 GHz range, in order to be higher than thermal excitations, but low enough for ease of microwave engineering. However, advantageously, because excitation energy of qubits is controlled by the circuit elements, qubits can be designed to have any frequency. Therefore, in general, qubits could be designed to operate with signals in other ranges of electromagnetic spectrum and embodiments of the present disclosure could be modified accordingly. All of these alternative implementations are within the scope of the present disclosure.

Use of Capacitors in Quantum Circuit Assemblies

For purposes of illustrating certain exemplary vertically-stacked parallel-plate capacitors described herein, it is important to understand in general how capacitors may be used in various quantum circuit assemblies. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides a schematic illustration of a quantum circuit assembly 100 that may include vertically-stacked parallel-plate capacitors, according to one embodiment of the present disclosure. For illustrative purposes, the quantum circuit assembly 100 is an example of a superconducting quantum circuit that may include any of the vertically-stacked parallel-plate capacitors described herein.

As shown in FIG. 1, an exemplary quantum circuit assembly 100 may include two or more qubits 102, e.g. superconducting qubits, where, in the present FIGS., reference numerals following after a dash, such as e.g. qubit 102-1 and 102-2 indicate different instances of the same or analogous element. Each of the qubits 102 may include one or more non-linear inductive elements (e.g., Josephson Junctions) 104. Josephson Junctions are integral building blocks in superconducting quantum circuits where they form the basis of quantum circuit elements that can approximate functionality of theoretically designed qubits. In general, a Josephson Junction includes two superconductors coupled by a so-called weak link that weakens the superconductivity between the two superconductors. In quantum circuits, a weak link of a Josephson Junction may e.g. be implemented by providing a thin layer of an insulating, non-superconductive metal, or a semiconducting material, typically referred to as a "barrier" or a "tunnel barrier," sandwiched, in a stack-like arrangement, between two layers of superconductor, which two superconductors serve as a first and a second electrode of a Josephson Junction. The Josephson Junction provides a non-linear inductive element to the circuit and allows the qubit to become an anharmonic oscillator. The anharmonicity is determined by the ratio of the charging energy, which stems from the total capacitance between a first and second element of the qubit, and the Josephson energy of the non-linear inductive element (e.g., Josephson Junction). The anharmonicity is what allows the state of the qubit to be controlled to a high level of fidelity by creating a 2-level system, e.g. ground state and first excited state that have energy separation substantially different than first- and second-excited states or transitions between other higher-level excited states. In addition to controlling the anharmonicity, the ratio between charging and Josephson energies also control the qubit frequency. The charge noise of a superconducting qubit can be reduced by implementing a shunt capacitor in parallel to the Josephson Junction(s). A large shunt capacitance has the effect of reducing the charging energy; this comes at the cost of reduced anharmonicity, but the reduction in charge noise at the cost of reduced anharmonicity is often beneficial, and when implemented in such a way so as to make the Josephson energy about 50 times greater than the charging energy (a regime typically referred to as the "transmon regime") a qubit with enough anharmonicity can be maintained while simultaneously reducing charge noise and thus extending qubit coherence times.

Typically, when a qubit employs only one Josephson Junction, a frequency of the qubit cannot be changed substantially beyond what is defined by the design unless one of the qubit capacitive elements is tunable. Employing two or more Josephson Junctions, e.g. arranged in a so-called superconducting quantum interference device (SQUID), allows controlling the frequency of the qubit even without the presence of a tunable capacitive element. This allows greater control as to whether and when the qubit interacts with other components of a quantum circuit, e.g. with other qubits. In general, a SQUID of a superconducting qubit includes a pair of Josephson Junctions and a loop of a conductive, typically superconductive material (i.e. a superconducting loop), connecting a pair of Josephson Junctions. Applying a net magnetic field in a certain orientation to the SQUID loop of a superconducting qubit allows controlling the frequency of the qubit. In particular, applying magnetic field to the SQUID region of a superconducting qubit is generally referred to as a "flux control" of a qubit, and the magnetic field is generated by providing direct-current (DC) and/or a relatively low-frequency, typically below 1 GHz, current through an electrically conductive or superconductive line generally referred to as a "flux bias line" (also known as a "flux line" or a "flux coil line"). By providing flux bias lines sufficiently close to SQUIDs, magnetic fields generated as a result of currents running through the flux bias lines extend to the SQUIDs, thus tuning qubit frequencies.

Turning back to FIG. 1, within each qubit 102, the one or more Josephson Junctions 104 may be directly electrically connected to one or more other circuit elements 106, which, in combination with the Josephson Junction(s) 104, form a non-linear oscillator circuit providing multi-level quantum system where the first two to three levels define the qubit under normal operation. One example of the circuit elements 106 is shunt capacitors, i.e. capacitors connected in electrical parallel to one or more non-linear inductive elements such as Josephson Junctions. Shunt capacitors may be implemented as vertically-stacked parallel-plate capacitors described herein. In general, the circuit elements 106 may further include superconducting loops of a SQUID, electrodes for setting an overall capacitance of a qubit, or ports for capacitively coupling the qubit to one or more of a readout resonator, a coupling or "bus" component, and a direct microwave drive line, or/and ports for electromagnetically coupling the qubit to a flux bias line.

As also shown in FIG. 1, an exemplary quantum circuit assembly 100 may include a plurality of non-resonant transmission lines 108, and, in some cases, a plurality of resonators 110.

The non-resonant transmission lines 108 are typically used for providing microwave signals to different quantum circuit elements and components, which elements and components include e.g. readout resonators for various qubits, and may be considered to implement external readout and/or control of qubits. For example, for superconducting qubits, examples of the non-resonant transmission lines 108 include flux bias lines, microwave lines, and drive lines. In another example, for quantum dot qubits, examples of the non-resonant transmission lines 108 include lines that may control microwave pulses applied to gates and/or the doped regions of quantum dot device(s) in order to control spins of charge carriers in quantum dots formed in such device(s) or microwave pulses transmitted over a conductive pathway to induce a magnetic field in magnet line(s) of quantum dot devices.

On the other hand, the resonators 110 may be viewed as implementing internal control lines for qubits. For superconducting qubits, examples of the resonators 100 include coupling and readout resonators.

In general, a resonator 110 of a quantum circuit differs from a non-resonant microwave transmission line 108 in that a resonator is deliberately designed to support resonant oscillations (i.e. resonance), under certain conditions. In contrast, non-resonant transmission lines may be similar to conventional microwave transmission lines in that they are designed to avoid resonances, especially resonances at frequencies/wavelengths close to the resonant frequencies/wavelengths of any resonant object used in the quantum computing circuits, e.g., qubits, bus resonators, or readout resonators in the proximity of such non-resonant lines. Once non-resonant transmission lines are manufactured, some of them may inadvertently support some resonances, but, during its design, efforts are taken to minimize resonances, standing waves, and reflected signals as much as possible, so that all of the signals can be transmitted through these lines without, or with as little resonance as possible.

On-chip capacitive coupling between quantum or control elements can be achieved either through use of coupling components such as a coupling component on a neighboring qubit, a lumped element capacitor, a lumped element resonator, or a transmission line segment. A resonator is a transmission line segment that is made by employing fixed boundary conditions, and these boundary conditions control the frequencies/wavelengths which will resonate within a given transmission line segment used to implement a resonator. In order to satisfy boundary conditions for resonance, each end of a transmission line segment resonator can be either a node, if it is shorted to ground (e.g. where one end of the transmission line segment structure is electrically connected to a ground plane), or an antinode, if it is capacitively or inductively coupled to ground or to another quantum circuit element. Thus, resonators 110 differ from non-resonant microwave transmission lines 108 in how these lines are terminated at the relevant ends. A line used to route a signal on a substrate, i.e. one of the non-resonant transmission lines 108, typically extends from a specific source, e.g. a bonding pad or another type of electrical connection to a source, to a specific load (e.g. a short circuit proximate to SQUID loop, a quantum dot device, another bonding pad, or another electrical connection to a load). In other words, non-resonant transmission lines 108 terminate with electrical connections to sources, ground sinks, and/or loads. On the other hand, a transmission line resonator is typically composed of a piece of transmission line terminated with either two open circuits (in case of a half-wavelength resonator) or an open and a short circuit (in case of a quarter-wavelength resonator). In this case, for a desired resonant frequency, transmission line length may e.g. be a multiple of a microwave wavelength divided by 2 or 4, respectively. However, other terminations are possible, for example capacitive or inductive, and in this case the required line length to support resonance will be different from that identified above. For example, capacitive terminations may be used for resonators which are coupled to qubits, to a feedline, line, or to another resonator by a capacitive interaction.

Besides line termination by capacitive or inductive coupling or a short circuit, in order to support resonant oscillations, transmission line segments of the resonators 110 need to be of a specific length that can support such oscillations. That is why, often times, resonators 110 may be laid out on a substrate longer than the actual distance would require (i.e. a non-resonant transmission line would typically be laid out to cover the distance in the most compact manner possible, e.g. without any curves, wiggles, or excess length, while a resonator may need to have curves, wiggles, and be longer than the shortest distance between the two elements the resonator is supposed to couple in order to be sufficiently long to support resonance).

One type of the resonators 110 used with superconducting qubits are so-called coupling resonators (also known as "bus resonators"), which provide one manner for coupling different qubits together in order to realize quantum logic gates. These types of resonators are analogous in concept and have analogous underlying physics as readout resonators, except that a coupling or "bus" resonator involves only capacitive couplings between two or more qubits whereas a readout resonator involves capacitive coupling between one or more qubits and a feedline. A coupling resonator may be implemented as a microwave transmission line segment that includes capacitive or inductive connections to ground on both sides (e.g. a half-wavelength resonator), which results in oscillations (resonance) within the transmission line. While the ends of a coupling resonator have open circuits to the ground, each side of a coupling resonator is coupled, either capacitively or inductively, to a respective (i.e. different) qubit by being in the appropriate location and sufficient proximity to the qubit. Because different regions of a coupling resonator have coupling with a respective different qubit, the two qubits are coupled together through the coupling resonator. Thus, coupling resonators may be employed for implementing logic gates.

Another type of the resonators 110 used with superconducting qubits are so-called readout resonators, which may be used to read the state(s) of qubits. In some embodiments, a corresponding readout resonator may be provided for each qubit. A readout resonator, similar to the bus coupling resonator, is a transmission line segment. On one end it may have an open circuit connection to ground as well as any capacitively or inductively coupled connections to other quantum elements or a non-resonant microwave feedline. On the other end, a readout resonator may either have a capacitive connection to ground (for a half-wavelength resonator) or may have a short circuit to the ground (for a quarter-wavelength resonator), which also results in oscillations within the transmission line, with the resonant frequency of the oscillations being close to the frequency of the qubit. A readout resonator is coupled to a qubit by being in the appropriate location and sufficient proximity to the qubit, again, either through capacitive or inductive coupling. Due to a coupling between a readout resonator and a qubit, changes in the state of the qubit result in changes of the resonant frequency of the readout resonator. In turn, changes in the resonant frequency of the readout resonator can be read externally via connections which lead to external electronics e.g. wire or solder bonding pads.

For the non-resonant transmission lines 108, some descriptions of flux bias lines were provided above and, in the interests of brevity are not repeated here. In general, running a current through a flux bias line, provided e.g. from a wirebonding pads, solder bump, mechanical connector, or any other connection element, allows tuning (i.e. changing) the frequency of a corresponding qubit 102 to which a given flux bias line is connected. As a result of running the current in a given flux bias line, magnetic field is created around the line. If such a magnetic field is in sufficient proximity to a given qubit 102, e.g. by a portion of the flux bias line being provided next (sufficiently close) to the qubit 102, the magnetic field couples to the qubit, thereby changing the Josephson energy and thus the spacing between the energy levels of the qubit. This, in turn, changes the frequency of the qubit since the frequency is directly related to the spacing between the energy levels via the equation $E=h\nu$ (Planck's equation), where E is the energy (in this case the energy difference between energy levels of a qubit), h is the Planck's constant and $\nu$ is the frequency (in this case the frequency of the qubit). As this equation illustrates, if E changes, then $\nu$ changes. Different currents and pulses of currents can be sent down each of the flux lines allowing for independent tuning of the various qubits.

Typically, the qubit frequency may be controlled in order to bring the frequency either closer to or further away from another resonant item, for example a coupling resonator or a coupled neighbor qubit, to implement multi-qubit interactions, as may be desired in a particular setting.

For example, if it is desirable that a first qubit 102-1 and a second qubit 102-2 interact, via a coupling resonator (i.e. an example of the resonators 110) connecting these qubits, then both qubits 102 may need to be tuned to be at nearly the same frequency or a detuning equal, or nearly equal, to the anharmonicity. One way in which such two qubits could interact is that, if the frequency of the first qubit 102-1 is tuned very close to the resonant frequency of the coupling resonator, the first qubit can, when in the excited state, relax back down to the ground state by emitting a photon (similar to how an excited atom would relax) that would resonate within the coupling resonator. If the second qubit 102-2 is also at this energy (i.e. if the frequency of the second qubit is also tuned very close to the resonant frequency of the coupling resonator), then it can absorb the photon emitted from the first qubit, via the coupling resonator coupling these two qubits, and be excited from its ground state to an excited state. Thus, the two qubits interact, or are entangled, in that a state of one qubit is controlled by the state of another qubit. In other scenarios, two qubits could interact via exchange of virtual photons, where the qubits do not have to be tuned to be at the same frequency with one another. In general, two or more qubits could be configured to interact with one another by tuning their frequencies to specific values or ranges.

On the other hand, it may sometimes be desirable that two qubits coupled by a coupling resonator do not interact, i.e. the qubits are independent. In this case, by applying magnetic flux, by means of controlling the current in the appropriate flux bias line, to one qubit it is possible to cause the frequency of the qubit to change enough so that the photon it could emit no longer has the right frequency to resonate on the coupling resonator or on the neighboring qubit via a virtual photon transfer through the bus. If there is nowhere for such a frequency-detuned photon to go, the qubit will be better isolated from its surroundings and will live longer in its current state. Thus, in general, two or more qubits could be configured to reduce interactions with one another by tuning their frequencies to specific values or ranges.

The state(s) of each qubit 102 may be read by way of its corresponding readout resonator of the resonators 110. As explained below, the state of qubit 102 induces a shift in the resonant frequency in the associated readout resonator. This shift in resonant frequency can then be read out using its coupling to a feedline. To that end, an individual readout resonator may be provided for each qubit. As described above, a readout resonator may be a transmission line segment that includes a capacitive connection to ground on one side and is either shorted to the ground on the other side (for a quarter-wavelength resonator) or has a capacitive connection to ground (for a half-wavelength resonator), which results in oscillations within the transmission line (resonance) that depends upon the state of a proximal qubit.

A readout resonator may be coupled to its corresponding qubit 102 by being in an appropriate location and sufficient proximity to the qubit, more specifically in an appropriate location and sufficient proximity to a first element (or "island") of the qubit 102 that capacitively couples to the readout resonator, when the qubit is implemented as a transmon. Due to a coupling between the readout resonator and the qubit, changes in the state of the qubit result in changes of the resonant frequency of the readout resonator. In turn, by ensuring that the readout resonator is in sufficient proximity to a corresponding microwave feedline, changes in the resonant frequency of the readout resonator induce changes in the transmission coefficients of the microwave feedline which may be detected externally.

A coupling resonator, or, more generally, a coupling component, allows coupling different qubits together, e.g. as described above, in order to realize quantum logic gates. A coupling component could be comprised of a coupling component on a neighboring qubit, a lumped element capacitor, a lumped element resonator, or a transmission line segment. A coupling transmission line segment (e.g., coupling resonator or bus resonator) is similar to a readout resonator in that it is a transmission line segment that includes capacitive connections to various objects (e.g., qubits, ground, etc.) on both sides (i.e. a half-wavelength resonator), which also results in oscillations within the coupling resonator. Each side/end of a coupling component is coupled (again, either capacitively or inductively) to a respective qubit by being in appropriate location and sufficient proximity to the qubit, namely in sufficient proximity to a first element (or "island") of the qubit that capacitively couples to the coupling component, when the qubit is implemented as a transmon. Because each side of a given coupling component has coupling with a respective different qubit, the two qubits are coupled together through the coupling component. Thus, coupling components may be employed in order to implement multi-qubit interactions.

In some implementations, a microwave line (also sometimes referred to as a "microwave feedline") may be used to not only readout the state of the qubits as described above, but also to control the state of the qubits. When a single microwave line is used for this purpose, the line operates in a half-duplex mode where, at some times, it is configured to readout the state of the qubits, and, at other times, it is configured to control the state of the qubits. In other implementations, microwave lines may be used to only readout the state of the qubits as described above, while separate drive lines, may be used to control the state of the qubits. In such implementations, microwave lines used for readout may be referred to as "microwave readout lines," while microwave lines used for controlling the quantum state of the qubits may be referred to as "microwave drive lines." Microwave drive lines may control the state of their respective qubits 102 by providing to the qubits a microwave pulse at or close to the qubit frequency, which in turn stimulates (i.e. triggers) a transition between the states of the qubit. By varying the length of this pulse, a partial transition can be stimulated, giving a superposition of the states of the qubit.

Flux bias lines, microwave lines, readout lines, drive lines, coupling components, and readout resonators, such as e.g. those described above, together form interconnects for supporting propagation of microwave signals. Further, any other connections for providing direct electrical interconnection between different quantum circuit elements and components, such as e.g. connections from electrodes of Josephson Junctions to plates of the capacitors or to superconducting loops of SQUIDs or connections between two ground lines of a particular transmission line for equalizing electrostatic potential on the two ground lines, may also be referred to as interconnects. Still further, the term "interconnect" may also be used to refer to elements providing electrical interconnections between quantum circuit elements and components and non-quantum circuit elements, which may also be provided in a quantum circuit, as well as to electrical interconnections between various non-quantum circuit elements provided in a quantum circuit. Examples of non-quantum circuit elements which may be provided in a quantum circuit may include various analog and/or digital systems, e.g. analog-to-digital converters, mixers, multiplexers, amplifiers, etc.

In various embodiments, various conductive circuit elements of supporting circuitry included in a quantum circuit such as the quantum circuit assembly 100 could have different shapes and layouts. In general, the term "line" as used herein in context of signal lines or transmission lines does not imply straight lines, unless specifically stated so. For example, some resonant or non-resonant transmission lines or parts thereof (e.g. conductor strips of resonant or non-resonant transmission lines) may comprise more curves, wiggles, and turns while other resonant or non-resonant transmission lines or parts thereof may comprise less curves, wiggles, and turns, and some transmission lines or parts thereof may comprise substantially straight lines.

The qubits 102, the non-resonant transmission lines 108, and the resonators 110 of the quantum circuit assembly 100 may be provided on, over, or at least partially embedded in a substrate (not shown in FIG. 1, but shown e.g. in FIGS. 3-6). The substrate may be any substrate suitable for realizing quantum circuit assemblies described herein.

In various embodiments, quantum circuit assemblies with vertically-stacked parallel-plate capacitors, such as the assembly shown in FIG. 1, may be used to implement components associated with a quantum IC. Such components may include those that are mounted on or embedded in a quantum IC, or those connected to a quantum IC. The quantum IC may be either analog or digital and may be used in a number of applications within or associated with quantum systems, such as e.g. quantum processors, quantum amplifiers, quantum sensors, etc., depending on the components associated with the IC. The IC may be employed as part of a chipset for executing one or more related functions in a quantum system.

In general, vertically-stacked parallel-plate capacitors as described herein may be used to implement various capacitors, or capacitive elements, in the quantum circuit assembly 100. For example, in some embodiments, vertically-stacked parallel-plate capacitors as described herein may be used as one or more of the circuit elements 106, e.g. shunt capacitors. In other embodiments, vertically-stacked parallel-plate capacitors as described herein may be used to implement other portions of a quantum circuit assembly, e.g. portions that may need to provide capacitive coupling between various quantum circuit elements, e.g. qubit to bus resonators, qubit to readout resonator, qubit to direct microwave drive line, etc. Additionally, vertically-stacked capacitor plates as described herein could be used to couple a qubit to other quantum circuit components, e.g. quantum circuit components as shown in the example of FIG. 2 (e.g. bus resonators, readout resonators, direct microwave drive lines, etc.), e.g. using implementations similar to implementations depicted in FIGS. 3 and 4.

Figure 2:
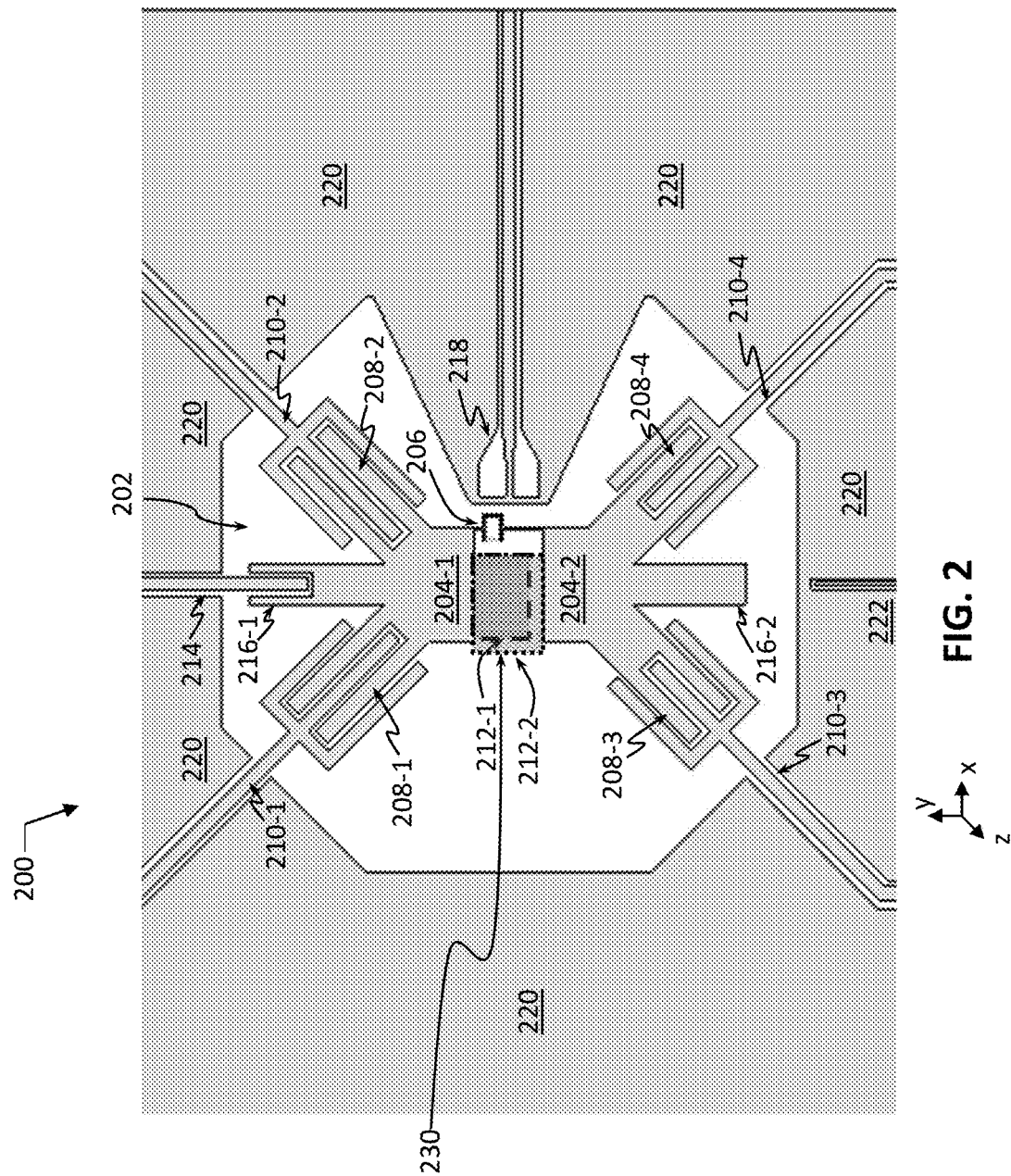
FIG. 2 illustrates an exemplary layout design of a quantum circuit assembly with a superconducting qubit device capacitively coupled to a plurality of quantum elements, according to one embodiment of the present disclosure.

FIG. 2 illustrates an exemplary layout design of a quantum circuit assembly, e.g. the quantum circuit assembly 100, implementing a superconducting qubit device capacitively coupled to 6 nearest neighbor quantum elements (4 bus resonators in turn capacitively coupled to 4-nearest neighbor qubits, 1 readout resonator, and 1 direct microwave drive line) and also coupled electromagnetically to one flux bias line for tuning the qubit's frequency, according to some embodiments of the present disclosure. While FIG. 2 illustrates an exemplary layout design of a quantum circuit assembly where an individual superconducting qubit may have 4 nearest neighbor qubits coupled via bus resonators, descriptions provided herein are equally applicable to quantum circuit assemblies with qubits having any other number (any one or more) of nearest neighbors, where the term "nearest neighbors" refers to neighbors which may be at different distances from a given qubit, as long as they are more highly capacitively coupled to the given qubit than other qubits.

In FIG. 2, the grey portions illustrate elements patterned from an electrically superconductive material (which may include any one or more materials such as e.g. superconductive materials listed above), while the white portions illustrate portions of an insulating material, e.g. portions of the substrate exposed by removal of the superconductive material. At the bottom of FIG. 2 an exemplary coordinate system x-y-z is illustrated so that various dimensions described herein may be referred to a particular axis x, y, or z along which the dimensions are measured. The view of FIG. 2 is of the x-y plane of such a coordinate system.

FIG. 2 illustrates a quantum circuit assembly 200 showing a superconducting qubit device 202. The qubit device 202 may be viewed as including two islands made of a superconductive material, shown in FIG. 2 as a first island 204-1 and a second island 204-2. Each of the two islands 204 has a direct electrical connection to at least one non-linear inductive element such as e.g. a Josephson Junction, but in FIG. 2 each of the two islands is shown to have a direct electrical connection to a SQUID 206 (schematically shown in FIG. 2 as a loop, representing the superconducting loop of a SQUID). In this manner, the first and second islands 204-1 and 204-2 are connected to one another via one or more non-linear inductive elements such as e.g. Josephson Junctions, e.g. via the SQUID 206. In general, as used herein, "islands" refer electrically conductive elements of a given superconducting qubit that are connected to one another via one or more non-linear inductive elements, e.g. Josephson Junctions.

Various portions of the islands 204-1 and 204-2 are labeled in FIG. 2 with their own reference numerals in order to differentiate their functionality from other portions. For example, each of the islands 204-1 and 204-2 include portions 208 used to capacitively couple to an end portion of a respective coupling component, e.g., in this case a coupling resonator formed by a transmission line segment, 210. Thus, FIG. 2 illustrates a portion 208-1 of the first island 204-1 being capacitively coupled to a first coupling resonator 210-1, a portion 208-2 of the first island 204-1 being capacitively coupled to a second coupling resonator 210-2, a portion 208-3 of the second island 204-2 being capacitively coupled to a third coupling resonator 210-3, and a portion 208-4 of the second island 204-2 being capacitively coupled to a fourth coupling resonator 210-4. Each of the coupling resonators 210 may couple the qubit 202 to an individual other superconducting qubit (these further qubits not shown in the view of FIG. 2), and may implement a coupling resonator of the resonators 110 described above.

The interdigitated geometry is schematically illustrated in the layout design shown in FIG. 2 where portions 208 of the qubit 202 are shown to form interdigitated capacitors with the ends of the corresponding coupling resonators 210 which are closest to such portions. While FIG. 2 illustrates each such interdigitated capacitor as having two fingers on the side of the respective portion 208 and having three fingers on the end side of the corresponding coupling resonator 210, in other embodiments, any other number of fingers of interdigitated capacitors may be used. Furthermore, descriptions provided with respect to FIG. 2 are equally applicable to embodiments where e.g. a shape of a portion of any coupling resonator 210 coupled to respective portion 208 of the qubit 202 is meandering (i.e. following a winding course, or comprising a plurality of convex and concave portions) and conformal to a shape of the portion 208, such two portions (i.e. a portion of any coupling resonator 210 and a respective portion 208) separated by a thin gap as to form a capacitor of an interlocking puzzle-piece shape, e.g. an interdigitated capacitor with one or more rounded corners, as well as to embodiments where portions 208 of the qubit 202 and the ends of the corresponding coupling resonators 210 which are closest to such portions form capacitors other than the interdigitated capacitors. Still further, in other embodiments (not specifically shown in FIG. 2), the portions 208 of the qubit 202 and the corresponding portions of the coupling resonators 210 may be implemented as any of the vertically-stacked parallel-plate capacitors described herein, instead of the interdigitated capacitors shown in FIG. 2. In such embodiments, instead of being interleaving in the shape of an interdigitated capacitor as shown in FIG. 2, an end portion 208 could be implemented as one capacitor plate of any of the vertically-stacked parallel-plate capacitors as described herein and a corresponding end portion of the respective coupling resonator 210 could be implemented as the other capacitor plate of any of the vertically-stacked parallel-plate capacitors as described herein.

Also shown in FIG. 2 are portions 212 of each of the islands 204-1 and 204-2. Thus, FIG. 2 illustrates a portion 212-1 of the first island 204-1 and a portion 212-2 of the second island 204-2. Portions 212-1 and 212-2 may be seen as forming first and second capacitor plates of a shunt capacitor 230 (i.e. an example of the circuit elements 106 shown in FIG. 1), connected in electrical parallel to one or more non-linear inductive elements, e.g. Josephson Junctions in the SQUID 206, where, in some embodiments, the shunt capacitor may be implemented as any of the vertically-stacked parallel-plate capacitors described herein. In the embodiment shown in FIG. 2, the distance between two such portions 212-1 and 212-2 (i.e. the gap between capacitor plates of a vertically-stacked parallel-plate capacitor 230, a dimension measured along the z-axis in the coordinate system shown in FIG. 2) may be substantially the same across these opposite portions. For example, in various embodiments, the distance between portions 212-1 and 212-2 may be between about 20 nanometers (nm) and 2 micrometers (um), including all values and ranges therein, e.g. between about 30 nm and 1 um, or between about 50 nm and 0.5 um. However, in other embodiments (not specifically shown in FIGS.), this distance may vary. Furthermore, in the embodiment shown in FIG. 2, portions 212-1 and 212-2 which are facing one another may be relatively small, as this may be beneficial for reducing the capacitance between the islands. In some embodiments, the capacitance (C) between the islands can be set by varying the area of the vertically-stacked capacitor plates (A) that face one another and their distance of separation (d), whereby the $C_{islands}$ is proportional to a ratio of A to d. In general this capacitance, in conjunction with the other capacitances in a quantum circuit, e.g. capacitances to the bus resonators, readout resonators, direct microwave drive lines, etc., may be used to set the total capacitance of the qubit and, thus, set the charging energy of the qubit. For a transmon qubit, the A and d of the vertically-stacked capacitor plates may be set by design so as to make the Josephson energy ($E_j$) larger than the charging energy ($E_c$), e.g., in some embodiments, $E_j$ may be set to be about 50 times greater than $E_c$ for a transmon qubit, so as to reduce charge noise of the qubit and extend qubit coherence times while maintaining sufficient anharmonicity for the qubit.

FIG. 2 further illustrates a readout resonator 214, capacitively coupled to a portion 216-1 of the first island 204-1. The readout resonator 214 may be a readout resonator of the resonators 110 described above. Although not specifically shown in FIG. 2), in some embodiments, the portion 216-1 of the first island 204-1 and the corresponding portions of the readout resonators 214 may be implemented as one of vertically-stacked parallel-plate capacitors described herein, instead of the partially interdigitated capacitor shown in FIG. 2. In such embodiments, instead of being interleaving as shown in FIG. 2, the portion 216-1 could be implemented as one capacitor plate of any of the vertically-stacked parallel-plate capacitors as described herein and a corresponding end portion of the respective readout resonator 214 could be implemented as the other capacitor plate of any of the vertically-stacked parallel-plate capacitors as described herein.

For symmetry, as shown in FIG. 2, in some embodiments the second island 204-2 may also have a similar portion 216-2, which may be coupled to a microwave drive line 222, for controlling the state of the qubit. In other embodiments, the coupling resonators 210, the readout resonators 214, and the microwave drive lines 222 may be arranged differently with respect to the qubit 202, e.g. based on routing requirements for a particular implementation. For example, this arrangement is different in the illustration of FIG. 4A where e.g. the superconducting qubit shown in the upper left portion of FIG. 4A is substantially similar to the qubit 202 shown in FIG. 2 except that locations where the microwave drive line 222 and the coupling resonator 210-4 of FIG. 2 are coupled to the qubit 202 are interchanged. In various embodiments, the microwave drive line 222 may be a microwave drive line of the non-resonant transmission lines 108 described above.

FIG. 2 further illustrates a flux bias line 218 provided in the vicinity of the SQUID 206 in order to tune the frequency of the qubit 202, as described above with reference to FIG. 1. The flux bias line 218 may be a flux bias line of the non-resonant transmission lines 108 described above. Finally, FIG. 2 also illustrates ground planes 220, i.e. portions of electrically conductive, preferably superconductive, material connected to the ground or some other reference potential, surrounding the qubit 202.

Various Designs for Vertically-Stacked Parallel-Plate Capacitors for Qubits

As described above, in general, a quantum circuit assembly may employ capacitors to realize different instances when capacitive coupling between various elements is needed. One example is when capacitive coupling between different elements of a given qubit device is needed, e.g. when shunt capacitors connected in electrical parallel to one or more Josephson Junctions are used to couple first and second islands 204 of a given qubit 202. Another example is when capacitive coupling between an element of one qubit device and an element of another qubit device or external circuitry is needed, e.g. when a portion of a given qubit device forms a capacitor with an opposing portion of a coupling resonator coupling said qubit device to another qubit device (e.g. portions 208-1 and 210-1 as described above), or e.g. when a portion of a given qubit device forms a capacitor with an opposing portion of a readout resonator used to determine the state of said qubit device (e.g. portions 216-1 and 214 as described above). In various embodiments, any of these coupling elements, including bus resonators, readout resonators, and direct microwave drive lines, may be implemented as any of the vertically-stacked parallel-plate capacitors described herein. In particular, FIGS. 3-6 illustrate various exemplary capacitor designs, showing cross-sectional and top-down views of quantum circuit assemblies with vertically-stacked parallel-plate capacitors in accordance with various embodiments of the present disclosure.

Each of FIGS. 3-6 illustrates a cross-sectional view and a top-down view of one exemplary quantum circuit assembly (upper and lower illustrations, respectively, shown in each of FIGS. 3-6). Namely, the cross-sectional view shown is a view of a y-z plane of the exemplary coordinate system shown in these FIGS. as well as in FIG. 2, while the top-down view shown in FIGS. 3-6 is a view of a y-x plane. The cross-sectional view shown is an example of a view obtained when a cross-section is taken along a plane perpendicular to the plane of the drawings and including a line shown as a horizontal dashed line AA in the top-down view of each of FIGS. 3-6. Light grey dashed lines extending between the upper and lower illustrations in each of FIGS. 3-6 are provided to indicate correspondence in scale between the various elements shown.

Figure 3:
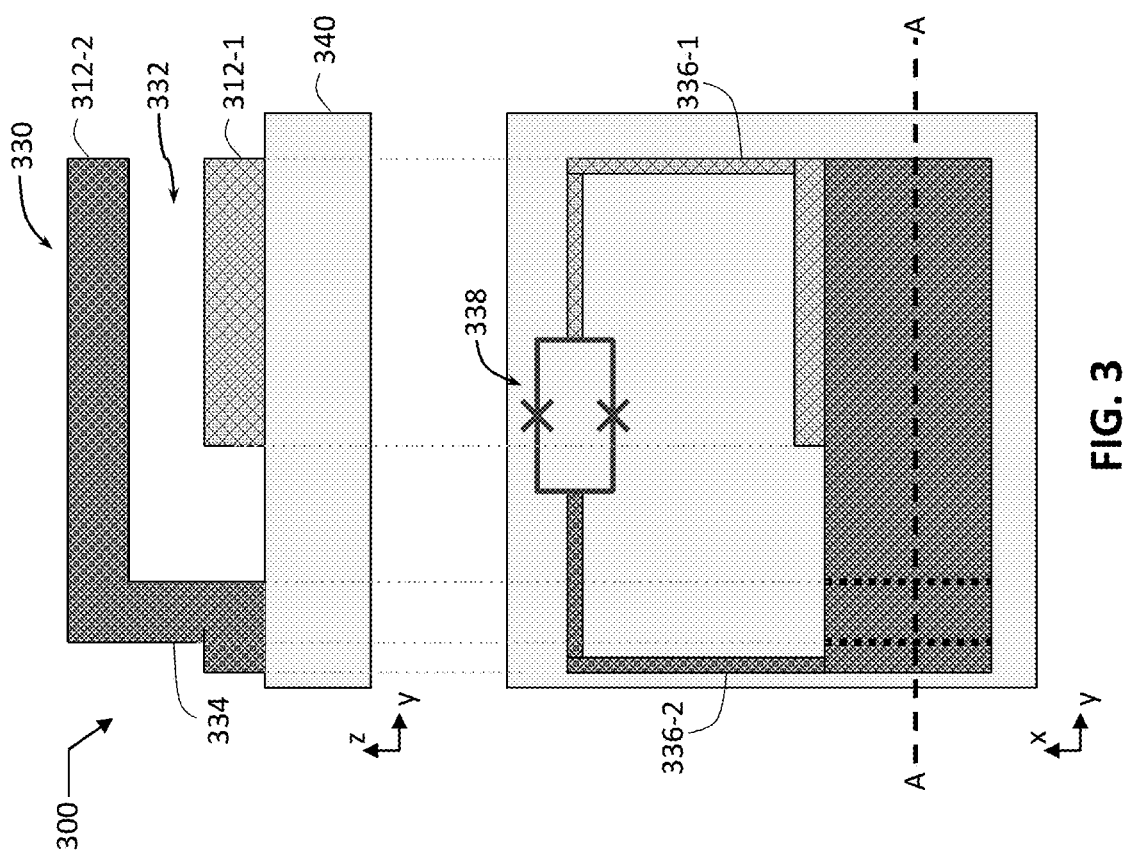
FIGS. 3-6 illustrate exemplary cross-sectional and top-down views of quantum circuit assemblies with vertically-stacked parallel-plate capacitors in accordance with various embodiments of the present disclosure.

In FIGS. 3-6, same reference numerals are used to indicate functionally analogous elements, although, as explained below, their configuration may be different according to different embodiments shown in these FIGS. Different patterns are used in FIGS. 3-6 to illustrate materials that may be different materials. In particular, a single pattern used to show elements labeled with different reference numerals in each of these FIGS. is intended to illustrate that these elements, or portions, may be made from the same material. For example, FIG. 3 illustrates that a cantilever support portion 334 may be made from the same material as a second capacitor electrode 312-2. While first and second capacitor electrodes are shown with different patterns, in some embodiments, they may be implemented from the same electrically conductive, preferably superconductive, material.

Turning to FIG. 3, FIG. 3 illustrates a capacitor 330, provided over a substrate 340. The substrate 340 may be any substrate suitable for realizing quantum circuit assemblies described herein. In one implementation, the substrate 340 may be a crystalline substrate such as, but not limited to a silicon or a sapphire substrate, and may be provided as a wafer or a portion thereof. In other implementations, the substrate 340 may be non-crystalline. In general, any material that provides sufficient advantages (e.g. sufficiently good electrical isolation and/or ability to apply known fabrication and processing techniques) to outweigh the possible disadvantages (e.g. negative effects of spurious TLS's), and that may serve as a foundation upon which a quantum circuit may be built, falls within the spirit and scope of the present disclosure. Additional examples of substrates that may be used as the substrate 340 include silicon-on-insulator (SOI) substrates, III-V substrates, and quartz substrates.

As shown in FIG. 3, the capacitor 330 includes a first capacitor plate 312-1 and a second capacitor plate 312-2, the plates 312 being substantially parallel to one another and to the substrate 340, and separated from one another by a gap 332. Thus, in contrast to conventional implementations of single-plane capacitors typically used in quantum circuit assemblies, the capacitor 330 is implemented in a vertical geometry, i.e. where at least a portion of the second capacitor plate 312-2 is stacked over the first capacitor plate 312-1, further away from the substrate 340 than the first capacitor plate 312-1. In various embodiments, the distance between the first and second capacitor plates 312-1 and 312-2 (a dimension measured along the z-axis of the exemplary coordinate system shown in the FIGS. 3-6, i.e. the size of the gap 332) may be between about 20 nm and 2000 nm, including all values and ranges therein, e.g. between about 30 nm and 1000 nm, or between about 40 nm and 200 nm. While the gap 332 is shown in FIG. 3 as an air/gas/vacuum gap, in other embodiments, the gap 332 could be filled with a liquid or a solid dielectric material.

Each of the capacitor plates 312-1 and 312-2 of the capacitor 330 may be made from any suitable electrically conductive, preferably superconductive material, some examples of which are listed above. In some embodiments, capacitor plates 312-1 and 312-2 of the capacitors 330 may be used to implement the portions 212-1 and 212-2, described above. In other embodiments, the capacitor 330 may be used to implement capacitive coupling of other portions of a quantum circuit assembly, as described above.

FIG. 3 illustrates an embodiment where the second capacitor plate 312-2 of the capacitor 330 forms a cantilever over the first capacitor plate 312-1 in that the second capacitor plate 312-2 may be supported on one side, by a cantilever support portion 334, which may be an extension of the second capacitor plate 312-2, but is free on the other side. In this way, at least a portion of the second capacitor plate 312-2 may be suspended over at least a portion of the first capacitor plate 312-1. Vertical dotted lines shown in the top-down view in FIG. 3 illustrates change in height of the electrically conductive material of the second capacitor plate 312-2 as the cantilever support portion 334 brings the second capacitor plate 312-2 down to the substrate 340.

In other embodiments of the capacitor 330, not specifically shown in FIG. 3, the second capacitor plate 312-2 may form a bridge over the first capacitor plate 312-1, i.e. in the cross-sectional illustration of the capacitor 330 as shown in FIG. 3, there could be a cantilever support portion similar to the portion 334 by on the right side of the second capacitor plate 312-2, extending the second capacitor plate 312-2 down to the substrate 340 and, thus, forming a bridge over the first capacitor plate 312-1. For example, in some such embodiments, the first capacitor plate 312-1 may be shaped as a "finger" or a "stub" under the bridging second capacitor plate 312-2.

In some embodiments, extensions of the first and second capacitor plates of the capacitor 330 may be routed, e.g. over the substrate 340, to connect to at least one non-linear inductive element, shown in the example of FIG. 3 as portions 336-1 and 336-2 (extending, respectively, from the first capacitor plate 312-1 and the second capacitor plate 312-2), connected to a SQUID loop 338 (shown in FIG. 3 as a loop with two crosses). In some embodiments, the SQUID loop 338 may implement two non-linear inductive elements, e.g. Josephson Junctions, schematically illustrated in FIG. 3 as the crosses within the SQUID loop 338. In this manner, the capacitor 330 may be connected in electrical parallel to the SQUID loop 338 (thus, the capacitor 330 shown in FIG. 3 is a shunt capacitor as described above, e.g. the capacitor plates 312-1 and 312-2 of the capacitors 330 may be used to implement the portions 212-1 and 212-2 of the quantum circuit assembly 200). Although not specifically shown in FIG. 3, in various other embodiments, the vertically-stacked capacitor plates 312-1 and 312-2 may be used to capacitively couple to other quantum circuit elements such as bus resonators, readout resonators, and/or direct microwave drive lines either through interdigitated capacitive elements in the same plane or vertically-stacked capacitive elements in stacked parallel planes.

In some embodiments of the quantum circuit assembly 300, the SQUID loop 338 may be an example of any of the SQUID loops 338 described above. In other embodiments of the quantum circuit assembly 300, the SQUID loop 338 may be replaced by a single non-linear inductive element, e.g. a single Josephson Junction. In some embodiments where the SQUID loop 338 is used, the SQUID loop 338 may be electromagnetically coupled to a flux bias line that may be used to deliver varying magnetic flux and thereby tune the qubit frequency, e.g. as described above.

Figure 4:
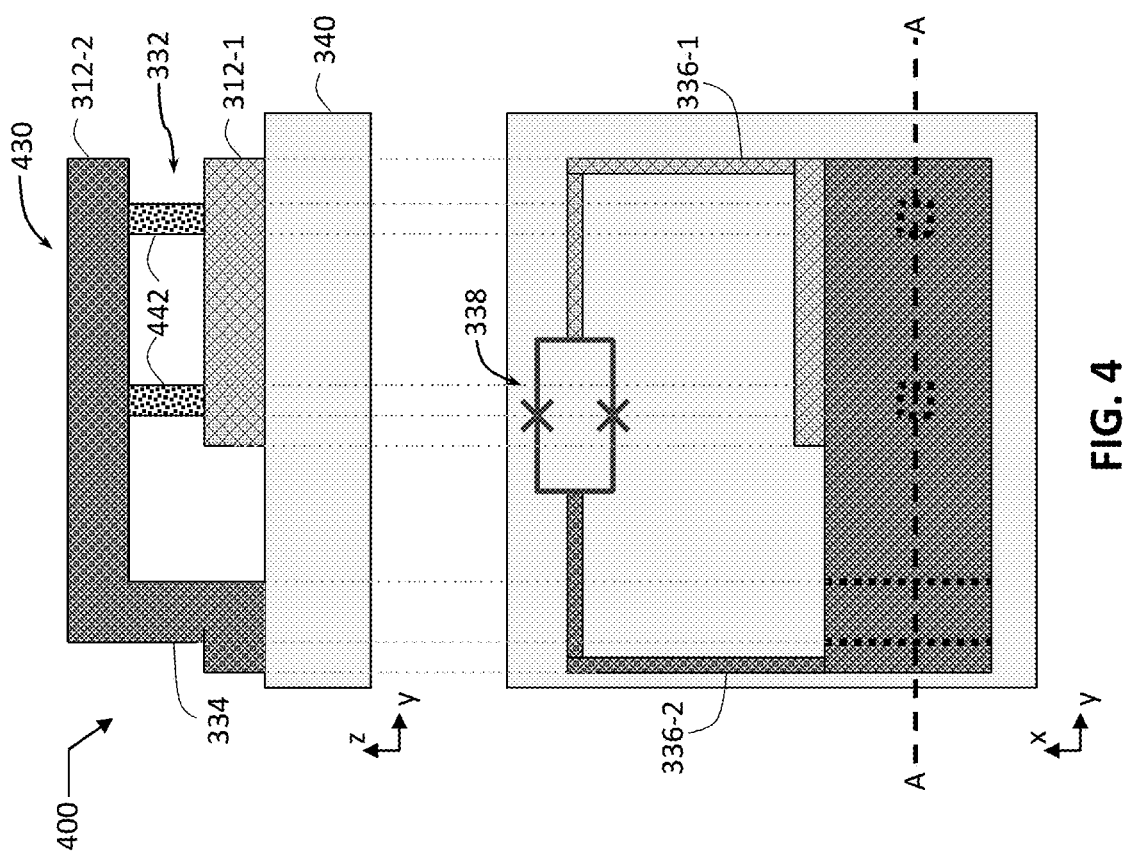

FIG. 4 illustrates a quantum circuit assembly 400 with a capacitor 430 provided over the substrate 340. In the interests of brevity, it can be assumed that, unless specified otherwise, descriptions provided with respect to the quantum circuit assembly 300 (and, in particular, with respect to the capacitor 330) are applicable to the quantum circuit assembly 400 (and, in particular, with respect to the capacitor 430), and therefore, are not repeated here. Only the differences, therefore, are described. To that end, the quantum circuit assembly 400 illustrates that, in some embodiments where the second capacitor plate 312-2 forms a cantilever over the first capacitor plate 312-1, the cantilever may be further mechanically supported by one or more support structures, shown in FIG. 4 as two support structures 442. As shown in FIG. 4, each of such one of more support structures 442 may have one end in contact with the first capacitor plate 312-1 and another end in contact with the second capacitor plate 312-2, in order to mechanically support at least a portion of the second capacitor plate 312-2 over at least a portion of the first capacitor plate 312-1. Thus, the height of the support structures 442 is substantially the same as the gap 332. In various embodiments, the support structures 442 may be made of any suitable insulating material, e.g. any suitable low-k dielectric material, such as, but not limited to, silicon dioxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. Two dotted squares shown in the top-down view in FIG. 4 illustrate outlines of the two exemplary support structures 442. In various other embodiments of the quantum circuit assembly 400, more than two or less than two supports structures 442 may be provided between the first and second capacitor electrodes 312-1, 312-2, and these support structures 442 may be provided at any suitable location in order to provide the desired mechanical support.

Figure 5:
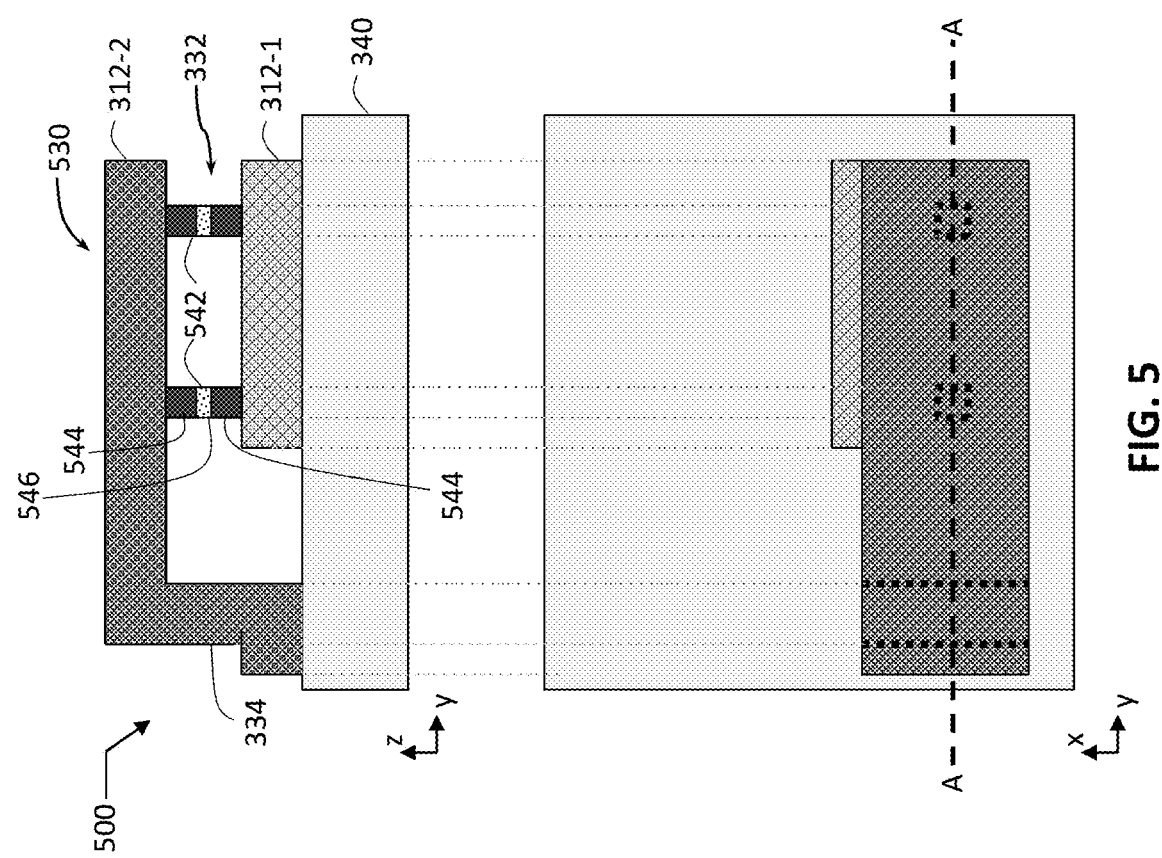
Figure 6:
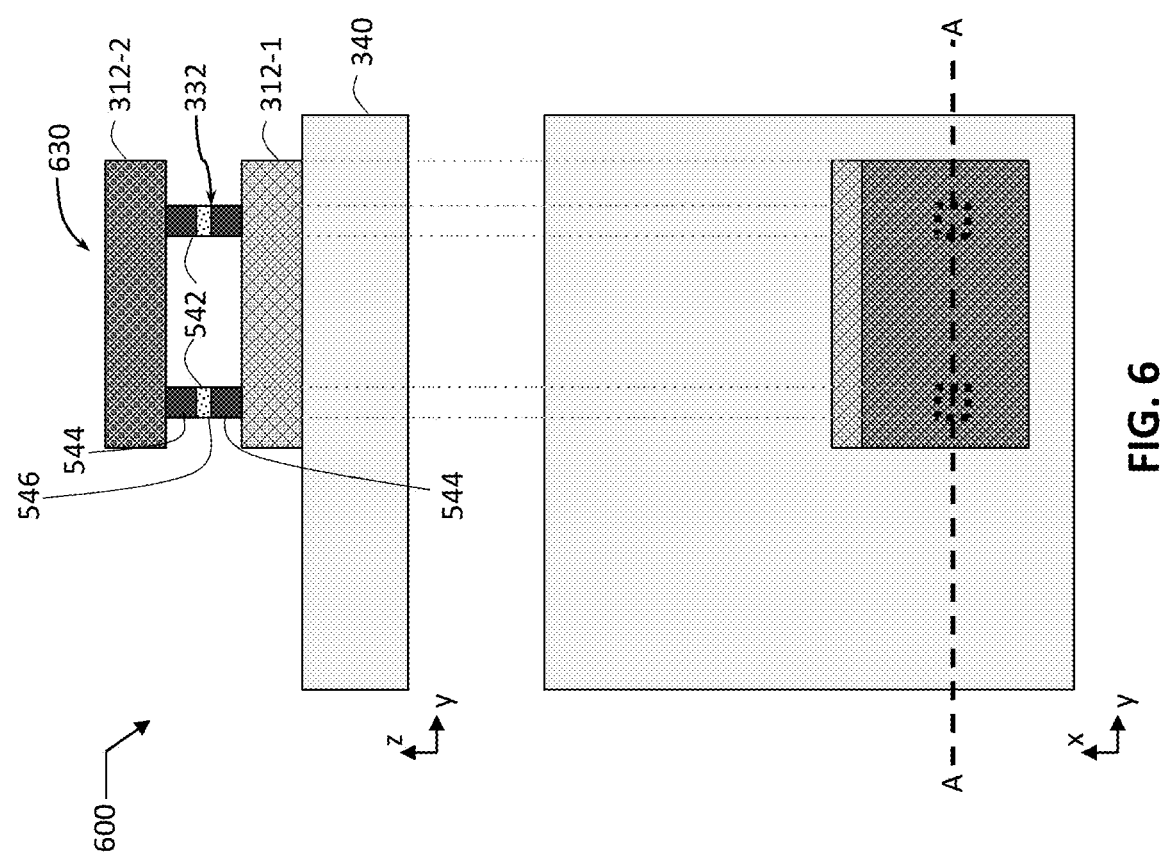

While both FIGS. 3 and 4 illustrate embodiments where the vertically-stacked parallel-plate capacitors are coupled to at least one non-linear inductive element by the non-linear inductive element provided over the substrate 340 and at a distance from the first and second capacitor plates 312-1, 312-2, in other embodiments, such one or more non-linear inductive elements may be provided in between the first and second capacitor plates 312-1, 312-2, as shown in FIGS. 5 and 6.

FIG. 5 illustrates a quantum circuit assembly 500 with a capacitor 530 provided over the substrate 340. In the interests of brevity, it can be assumed that, unless specified otherwise, descriptions provided with respect to the quantum circuit assembly 300 (and, in particular, with respect to the capacitor 330) are applicable to the quantum circuit assembly 500 (and, in particular, with respect to the capacitor 530), and therefore, are not repeated here. Only the differences, therefore, are described. To that end, the quantum circuit assembly 500 illustrates that, in some embodiments, one or more non-linear inductive elements may be provided between first and second capacitor plates 312 instead of at a different location as was shown in FIG. 3 with a separate SQUID loop 338. In particular, FIG. 5 illustrates that, in some embodiments, two non-linear inductive elements, e.g. two Josephson Junctions 542, may be provided between the first and second capacitor plates 312. Each Josephson Junction 542 may be a superconductor-insulator-superconductor (SIS) Josephson Junction, as shown in FIG. 5 with each Josephson Junction 542 including a first and second electrodes (made of any suitable superconducting material) 544, separated by a tunnel barrier 546 of a suitable dielectric material (544, 546 labeled in FIG. 5 for only one Josephson Junction 542 in order to not clutter the drawing).

As shown in FIG. 5, one electrode 544 of each the Josephson Junction 542 may be in contact with the first capacitor plate 312-1, while another electrode 544 may be in contact with the second capacitor plate 312-2, with the tunnel barrier 546 provided between the two electrodes 544. In this manner, the capacitor 530 may be coupled, in electrical parallel, to the two Josephson Junctions 542. In addition, the Josephson Junctions 542 may help provide mechanical support to at least a portion of the second capacitor plate 312-2 that may be suspended over at least a portion of the first capacitor plate 312-1. In various embodiments, the electrodes 544 of the Josephson Junctions 542 may be made of any suitable superconductive material, e.g. aluminum, or any other suitable superconductive material some examples of which are described above, while the tunnel barrier 546 may be formed of any suitable insulator. In some embodiments, the tunnel barrier material 546 could be selected as any dielectric material of sufficiently high quality (i.e. low losses in terms of spurious TLS's), such as e.g. silicon oxide, hafnium oxide, magnesium oxide, or aluminum oxide.

Two dotted squares shown in the top-down view in FIG. 5 illustrate outlines of the two exemplary Josephson Junction 542. In various embodiments, the Josephson Junctions 542 may be oriented along the y-axis in the x-y plane as depicted in FIGS. 5 and 6, or, alternatively, along the x-axis or any other arbitrary direction in the x-y plane. In various other embodiments of the quantum circuit assembly 500, only one Josephson Junction 542 may be used, instead of two. Furthermore, in various further embodiments, one or more additional mechanical support structures may also be used, e.g. one or more supports structures 442, in addition to the one or more Josephson Junctions 542, to provide further mechanical support.

FIG. 6 illustrates a quantum circuit assembly 600 with a capacitor 630 provided over the substrate 340. In the interests of brevity, it can be assumed that, unless specified otherwise, descriptions provided with respect to the quantum circuit assembly 500 (and, in particular, with respect to the capacitor 530) are applicable to the quantum circuit assembly 600 (and, in particular, with respect to the capacitor 630), and therefore, are not repeated here. Only the differences, therefore, are described. To that end, the quantum circuit assembly 600 illustrates that, in some embodiments, the upper capacitor plate of a vertically-stacked parallel-plate capacitor, in the example shown—the second capacitor plate 312-2 of the capacitor 630, does not have to be routed down to the substrate 340. Instead, any electrical connections that may need to be made to that capacitor plate (not specifically shown in FIG. 6 because it would depend on a specific quantum circuit design) may be made in the plane of that plate, i.e. above the qubit plane and above the substrate 340, or, in some embodiments, no electrical connections may need to be made.

In various embodiments of the vertically-stacked parallel-plate capacitors 330, 430, 530, and 630, various dimensions of the first and second capacitor plates 312-1, 312-2, may depend on a particular design and on what kind of capacitive coupling is intended to be implemented using such capacitors. To first order, the capacitance (C) between the plates can be set by varying the area of the vertically-stacked capacitor plates (A) that face one another and their distance of separation (d), whereby the $C_{islands} \approx \varepsilon \cdot A/d$. As described above, in general, this capacitance, in conjunction with the other capacitances to the bus resonators, readout resonators, direct microwave drive lines, etc., may be used to set the total capacitance of the qubit and thus the charging energy of the qubit.

Various quantum circuit assemblies described herein, e.g. the quantum circuit assemblies described with reference to FIGS. 1-6, do not represent an exhaustive set of quantum circuit assemblies that may utilize vertically-stacked parallel-plate capacitors but merely provide examples of such assemblies. Although particular arrangements of materials are discussed with reference to FIGS. illustrating exemplary quantum circuit assemblies with vertically-stacked parallel-plate capacitors, in some embodiments, various intermediate materials may be included in the vertically-stacked parallel-plate capacitors or/and in other components of the quantum circuit assemblies of these FIGS. Note that FIGS. illustrating exemplary quantum circuit assemblies are intended to show relative arrangements of the components therein, and that quantum circuit assemblies of these FIGS. may include other components that are not illustrated (e.g., various interfacial layers between materials, various electrical connections to e.g. capacitor electrodes or other electrically conductive elements, etc.). Further, relative position of various components shown may be different—e.g. in some embodiments, the first capacitor-plate 312-1 may be partially buried in the substrate 340, e.g. be provided in a recess of the substrate 340. Additionally, although some components of the quantum circuit assemblies are illustrated in FIGS. as being planar rectangles or formed of rectangular solids, this is simply for ease of illustration, and various components in other embodiments of these quantum circuit assemblies may be curved, rounded, or otherwise irregularly shaped as dictated by, and sometimes inevitable due to, the manufacturing processes used to fabricate the components or by design in order to reduce losses associated with strong electromagnetic fields at sharp corners and/or geometries.

Manufacturing Vertically-Stacked Parallel-Plate Capacitors

Vertically-stacked parallel-plate capacitors as described herein, such as e.g. the vertically-stacked parallel-plate capacitors 330, 430, 530, or 630 described above, may be fabricated using various suitable techniques, all of which being within the scope of the present disclosure. One such exemplary technique is shown in FIG. 7, providing a flow diagram of an illustrative method 700 of manufacturing a vertically-stacked parallel-plate capacitor, in accordance with various embodiments of the present disclosure.

Various operations of the method 700 may be illustrated with reference to some exemplary embodiments discussed herein, but at least portions of the method 700 may be used to manufacture any suitable vertically-stacked parallel-plate capacitors according to any embodiments of the present disclosure. In addition, although the operations of the method 700 are illustrated in FIG. 7 once each and in a particular order, the operations may be performed in any suitable order and repeated as desired. For example, one or more operations may be performed in parallel to manufacture multiple vertically-stacked parallel-plate capacitors as described herein substantially simultaneously. In another example, the operations may be performed in a different order to reflect the architecture of a particular quantum circuit component that may include one or more vertically-stacked parallel-plate capacitors according to any of the embodiments of the present disclosure.

Figure 7:
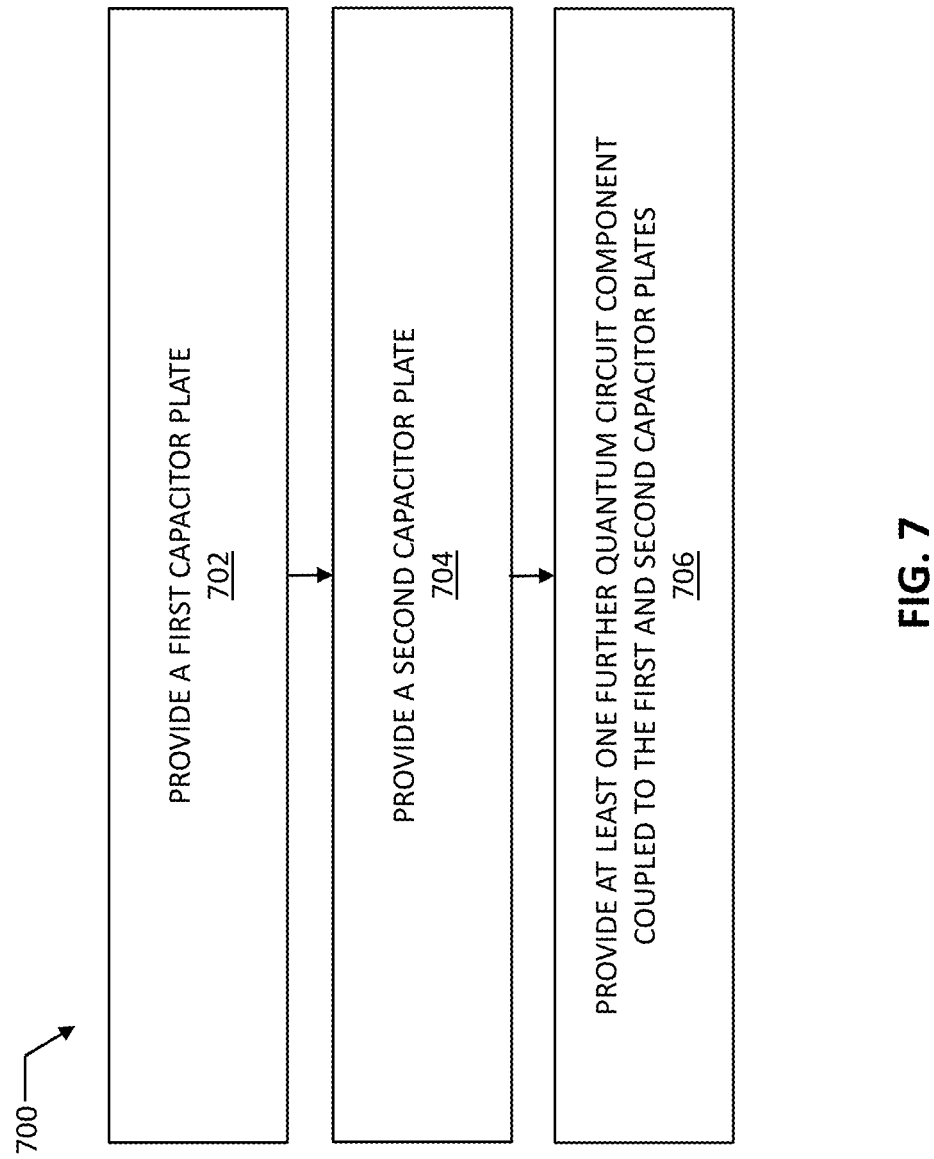
FIG. 7 is a flow diagram of an illustrative method of manufacturing a vertically-stacked parallel-plate capacitor, according to one embodiment of the present disclosure.

Furthermore, the manufacturing method 700 may include other operations, not specifically shown in FIG. 7, such as e.g. various deposition, cleaning, and/or planarization operations as known in the art. For example, in some embodiments, the substrate 340 may be cleaned prior to or/and after any of the processes of providing the vertically-stacked parallel-plate capacitor as described herein, e.g. to remove oxide, surface-bound organic and metallic contaminants, as well as subsurface contamination. In some embodiments, cleaning may be carried out using e.g. a chemical solutions (such as peroxide), and/or with ultraviolet (UV) radiation combined with ozone, and/or oxidizing the surface (e.g., using thermal oxidation) then removing the oxide (e.g. using hydrofluoric acid (HF)). In another example, in some embodiments, the quantum circuit assemblies as described herein may be planarized prior to or/and after any of the processes of providing the vertically-stacked parallel-plate capacitors as described herein, e.g. to remove the overburden of the materials deposited on the surfaces and to expose certain underlying elements. In some embodiments, planarization may be carried out using a polishing process such as e.g. chemical mechanical planarization (CMP), using a suitable slurry formulation and mechanical polishing process to remove unwanted materials from a wafer/structure, achieving a relatively smooth upper surface upon which further components of the quantum circuit assembly may be built. In some embodiments, sacrificial layers may be deposited in order to provide a second capacitor plate in 704, and then be removed in order for the elements provided in 702 and 704 to be electrically isolated and thereby form vertically-stacked capacitor plates.

Turning to FIG. 7, the method 700 may include a process 702 in which a first capacitor plate of a future vertically-stacked parallel-plate capacitor is provided. The first capacitor plate provided in the process 702 may take form of any embodiments of the first capacitor plate 312-1 described herein. In various embodiments, the process 702 may include depositing a suitable conductive material onto selected surfaces of a substrate, e.g. the substrate 340, e.g. using any suitable techniques, such as e.g. atomic layer deposition (ALD), chemical vapor deposition (CVD), plasma enhanced CVD (PECVD), or/and physical vapor deposition (PVD) processes such as sputtering, possibly in combination with any suitable patterning technique, e.g. photolithographic or electron-beam patterning, and/or in combination with using a mask. The electrically conductive materials of the first capacitor plate, and of the second capacitor plate, may include any conducting or superconducting material suitable for providing electrical connectivity in a quantum circuit, such as e.g. Al, Nb, NbN, NbTiN, TiN, MoRe, etc., or any alloy of two or more superconducting/conducting materials.

The method 700 may include a process 704 in which a second capacitor plate of the future vertically-stacked parallel-plate capacitor is provided. The second capacitor plate provided in the process 704 may take form of any embodiments of the first capacitor plate 312-2 described herein, separated from the first capacitor plate 312-1 by a gap 332, as described above.

In various embodiments, the process 704 may include use of sacrificial materials which may be deposited and then at least partially removed in order to suspend a portion of the second capacitor plate over the first capacitor plate according to any embodiments described herein. A material which may be referred to as "sacrificial" because some or all of it will be removed in a later process. For example, the process 704 may include depositing, over the first capacitor plate, one or more sacrificial materials having sufficient etch selectivity with respect to at least the conductive material deposited in 702, as well as preferably etch selective with respect to the material of the substrate 340, in order for an etch process used in a later stage to remove some or all of the deposited sacrificial material to not etch substantially into the conductive material deposited in 702 or the material of the substrate 340. As known in the art, two materials are said to have "sufficient etch selectivity" when etchants used to etch one material do not substantially etch the other, enabling selective etching of one material but not the other. Besides appropriate etching characteristics, some other considerations in selecting a suitable material for the sacrificial material used in 704 may include e.g. possibilities of smooth film formation, low shrinkage and outgassing, and good dielectric properties (such as e.g. low electrical leakage, suitable value of a dielectric constant, and thermal stability). In some embodiments, the sacrificial material used in 704 may be a sacrificial dielectric material, such as e.g. any of the low-k or high-k dielectric materials used in semiconductor processing, including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used as the sacrificial material in 704 may include, but are not limited to silicon nitride, silicon oxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. Examples of low-k materials that may be used as the sacrificial material in 704 may include, but are not limited to, fluorine-doped silicon dioxide, carbon-doped silicon dioxide, spin-on organic polymeric dielectrics such as e.g. polyimide, polynorbornenes, benzocyclobutene, and polytetrafluoroethylene (PTFE), or spin-on silicon-based polymeric dielectric such as e.g. hydrogen silsesquioxane (HSQ) and methylsilsesquioxane (MSQ)). Next, an electrically conductive material of the second capacitor plate may be deposited over the sacrificial material, and patterned to form the second capacitor plate, using any suitable technique, e.g. those described above for the process 702. Finally, some or all of the sacrificial material may be removed to provide a gap between the first and second capacitor plates, as described herein. In various embodiments, removal of the sacrificial material to suspend a portion of the second capacitor plate over the first capacitor plate may be achieved using any suitable technique for removing desired portions of dielectric materials, e.g. dry etch (e.g. RIE) or wet etch, possibly in combination with any suitable patterning technique, e.g. photolithographic or electron-beam patterning, and/or in combination with using a mask.

Optionally, the method 700 may also include a process 706 that includes providing at least one further quantum circuit component, e.g. at least one non-linear inductive element, coupled to the capacitor by being coupled to the first and second capacitor plates. Which quantum circuit component is provided in the process 706, and by which techniques, would depend on the nature and the arrangement of the quantum circuit component with respect to the first and second capacitor plates and would be apparent to a person of ordinary skilled in the art based on known techniques for providing such components and based on the considerations with respect to the vertically-stacked parallel-plate capacitors provided herein.

Exemplary Qubit Devices

Quantum circuit assemblies/structures incorporating vertically-stacked parallel-plate capacitors as described above may be included in any kind of qubit devices or quantum processing devices/structures. Some examples of such devices/structures are illustrated in FIGS. 8A-8B, 9, and 10.

Figure 8B:
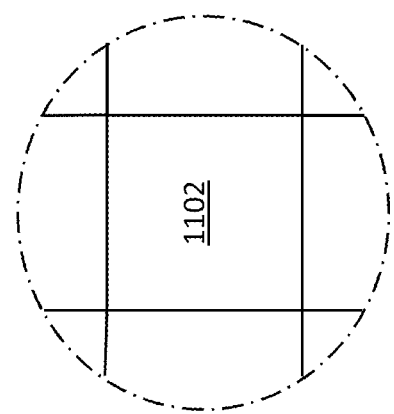
FIGS. 8A and 8B are top-down views of a wafer and dies that may include one or more quantum circuit assemblies with one or more vertically-stacked parallel-plate capacitors in accordance with various embodiments of the present disclosure.
Figure 8A:
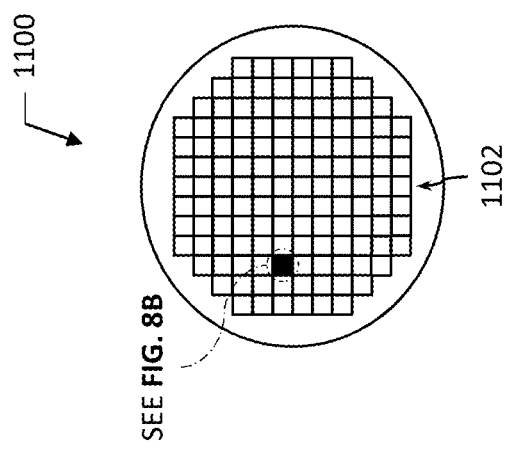

FIGS. 8A-8B are top-down views of a wafer 1100 and dies 1102 that may be formed from the wafer 1100, according to some embodiments of the present disclosure. The dies 1102 may include any of the quantum circuit assemblies disclosed herein, e.g., quantum circuit assemblies comprising superconducting qubits, spin qubits, or any combination of various types of qubits, and may include any one or more of the vertically-stacked parallel-plate capacitors described herein, such as e.g. the vertically-stacked parallel-plate capacitors 230, 330, 430, 530, or 630, each of which may be implemented according to e.g. at least portions of the method shown in FIG. 7, or any further embodiments of the vertically-stacked parallel-plate capacitors as described herein. In particular, the wafer 1100 may be any the form of the qubit substrates as proposed herein, and may further include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include one or more quantum circuit assemblies 100, including any supporting conductive circuitry to route electrical signals within the quantum circuit assemblies 100, as well as any other IC components. In some embodiments, the wafer 1100 or the die 1102 may include a memory device (e.g., a static random access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 10) or other logic that is configured to store information in the memory devices or execute instructions stored in the memory array.

Figure 9:
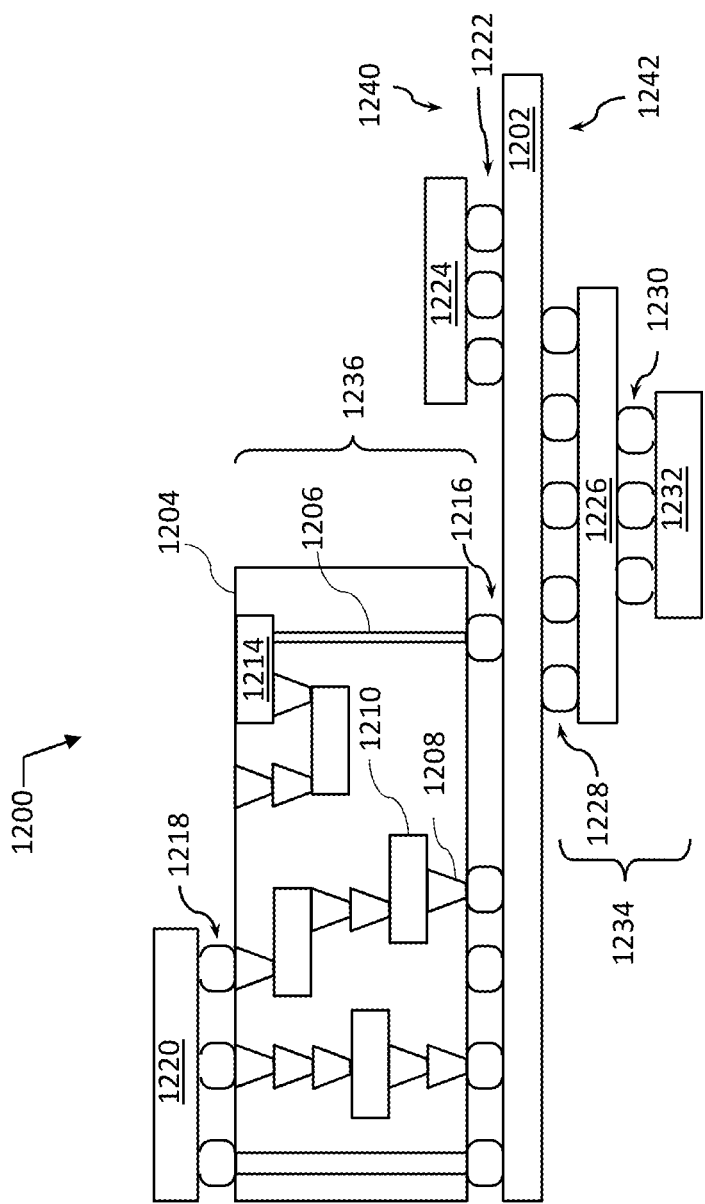
FIG. 9 is a cross-sectional side view of a device assembly that may include one or more quantum circuit assemblies with one or more vertically-stacked parallel-plate capacitors in accordance with various embodiments of the present disclosure.

FIG. 9 is a cross-sectional side view of a device assembly 1200 that may include any of the vertically-stacked parallel-plate capacitors disclosed herein, such as e.g. those described with reference to FIGS. 1-7, or any further embodiments of the vertically-stacked parallel-plate capacitors as described herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 9 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 9), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 9, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g. a package including quantum circuit assemblies with any of the vertical transmission lines described herein, or a combination thereof, or may be a conventional IC package, for example. In case the package 1220 is a quantum circuit device package including at least one quantum circuit assembly with any of the vertically-stacked parallel-plate capacitors described herein, at least portions of the vertically-stacked parallel-plate capacitors therein may be electrically connected to the interposer 1204 by the coupling components 1218. Generally, the interposer 1204 may spread a connection to a wider pitch or reroute a connection to a different connection. For example, the interposer 1204 may couple the package 1220 (e.g., a die) to a BGA of the coupling components 1216 for coupling to the circuit board 1202. In the embodiment illustrated in FIG. 9, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including one or more quantum circuits with qubits as described herein or may be a conventional IC package, for example. In some embodiments, the package 1224 may take the form of any of the embodiments of the quantum circuit with any of the quantum circuit assemblies described herein.

The device assembly 1200 illustrated in FIG. 9 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein, e.g. by including the qubit substrates as described herein, or may be a conventional IC package, for example.

Figure 10:
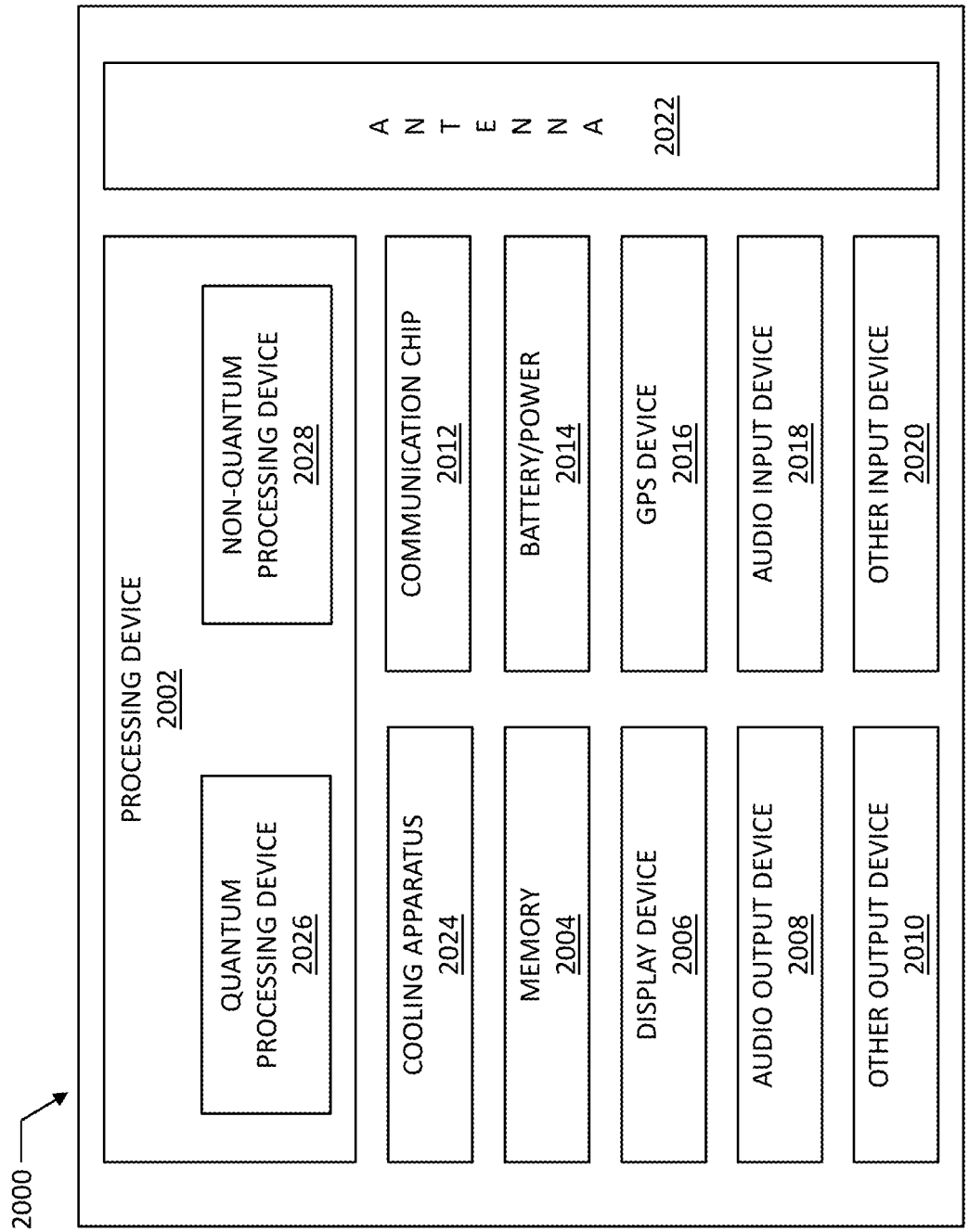
FIG. 10 is a block diagram of an example quantum computing device that may include one or more quantum circuit assemblies with one or more vertically-stacked parallel-plate capacitors in accordance with various embodiments of the present disclosure.

FIG. 10 is a block diagram of an exemplary quantum computing device 2000 that may include any of the quantum circuit assemblies with vertically-stacked parallel-plate capacitors as disclosed herein, such as e.g. those described with reference to FIGS. 1-7, or any further embodiments of the vertically-stacked parallel-plate capacitors as described herein. A number of components are illustrated in FIG. 10 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum circuit assemblies described herein. In some embodiments, various ones of these components may be fabricated onto a single system-on-a-chip (SoC) die. Additionally, in various embodiments, the quantum computing device 2000 may not include one or more of the components illustrated in FIG. 10, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008, but may include audio input or output device interface circuitry (e.g., connectors and supporting circuitry) to which an audio input device 2018 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more quantum circuit assemblies including any of the vertically-stacked parallel-plate capacitors disclosed herein, and may perform data processing by performing operations on the qubits that may be generated in the quantum circuit assemblies with any of the vertical transmission lines disclosed herein, and monitoring the result of those operations. For example, different qubits may be allowed to interact, the quantum states of different qubits may be set or transformed, and the quantum states of different qubits may be read, examples of some of which operations have been described above. The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed herein, the display device 2006 discussed herein, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2024. The cooling apparatus 2024 may maintain the quantum processing device 2026, in particular the quantum circuits with any of the vertical transmission lines as described herein, at a predetermined low temperature during operation to avoid qubit decoherence and to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2024 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Select Examples

The following paragraphs provide some select examples of various ones of the embodiments disclosed herein.

Example 1 provides a quantum circuit assembly that includes a substrate, at least one qubit device (but typically a plurality of such qubit devices) provided over or at least partially in the substrate. The qubit device includes a capacitor having a first capacitor plate provided in a first plane and a second capacitor plate provided in a second plane. The second plane is substantially parallel to and separated from the first plane by a gap comprising a dielectric medium. Furthermore, the second plane is farther away from the substrate than the first plane. Both the first and the second capacitor plates may be substantially parallel to the substrate. Such a capacitor may be referred to as a "parallel-plate capacitor" because capacitor plates/electrodes lie in parallel planes separated by a gap. Such a capacitor is "vertically-stacked" because the second capacitor plate has at least a portion that is stacked in a plane farther away from the substrate than the first capacitor plate.

Example 2 provides the quantum circuit assembly according to example 1, where at least a portion of the second capacitor plate is suspended over at least a portion of the first capacitor plate (thus, again, the first capacitor plate is the plate closest to the substrate, e.g. provided over the substrate, and the second capacitor plate is the plate that is farther away from the substrate).

Example 3 provides the quantum circuit assembly according to examples 1 or 2, where the second capacitor plate includes a portion forming a bridge or a cantilever over a portion of the first capacitor plate (thus, again, the first capacitor plate is the plate closest to the substrate, e.g. provided over the substrate, and the second capacitor plate is the plate that is farther away from the substrate).

Example 4 provides the quantum circuit assembly according to any one of the preceding examples, further including at least one support structure between the first capacitor plate and the second capacitor plate, configured to mechanically support at least a portion of the second capacitor plate over at least a portion of the first capacitor plate.

Example 5 provides the quantum circuit assembly according to example 4, where the at least one support structure includes a first end, in contact with the first capacitor plate, and a second end, in contact with the second capacitor plate.

Example 6 provides the quantum circuit assembly according to examples 4 or 5, where the at least one support structure is an electrical insulator.

Example 7 provides the quantum circuit assembly according to any one of the preceding examples, where the first capacitor plate is separated from the second capacitor plate by a dielectric medium in the gap.

Example 8 provides the quantum circuit assembly according to example 7, where the dielectric medium is gaseous (e.g. air) or vacuum. In other embodiments, the gap between the first and second capacitor plates may be filled with a solid or liquid dielectric material.

Example 9 provides the quantum circuit assembly according to any one of the preceding examples, where the gap (i.e.

the distance between the first capacitor plate and the second capacitor plate, a dimension measured along the z-axis of the exemplary coordinate system shown in the FIGS.) is between about 20 and 2000 nanometers, including all values and ranges therein, e.g. between about 30 and 1000 nanometers, or between about 40 and 200 nanometers.

Example 10 provides the quantum circuit assembly according to any one of the preceding examples, where the qubit device is a transmon qubit.

Example 11 provides the quantum circuit assembly according to any one of the preceding examples, where the qubit device further includes at least one non-linear inductive element (e.g. at least one Josephson Junction) provided over or at least partially in the substrate, and where the capacitor is coupled to the at least one non-linear inductive element.

Example 12 provides the quantum circuit assembly according to example 11, where the at least one non-linear inductive element includes at least one Josephson Junction.

Example 13 provides the quantum circuit assembly according to examples 11 or 12, where the at least one non-linear inductive element includes a SQUID including two or more Josephson Junctions connected by a superconductor loop.

Example 14 provides the quantum circuit assembly according to any one of examples 11-13, where the capacitor is coupled to the at least one non-linear inductive element by being connected in electrical parallel to the at least one non-linear inductive element (e.g. the capacitor may be a shunt capacitor for the circuit that includes the non-linear inductive element).

Example 15 provides the quantum circuit assembly according to any one of examples 11-14, where the at least one non-linear inductive element is between the first capacitor plate and the second capacitor plate, and may be further configured to mechanically support at least a portion of the second capacitor plate over at least a portion of the first capacitor plate.

Example 16 provides the quantum circuit assembly according to example 15, where the at least one non-linear inductive element includes a first portion in contact with the first capacitor plate and a second portion in contact with the second capacitor plate.

Example 17 provides the quantum circuit assembly according to example 16, where the at least one non-linear inductive element is a Josephson Junction, the first portion is a first electrode of the Josephson Junction, the second portion is a second electrode of the Josephson Junction, and the first and second electrodes of the Josephson Junction are separated by a tunnel barrier, e.g. an insulator or some other weak link between the first and second electrodes, forming a tunnel barrier of the Josephson Junction.

Example 18 provides the quantum circuit assembly according to any one of the preceding examples, further including a flux bias line, provided either in or out of the qubit plane, configured to control a frequency of the qubit device by e.g. providing electromagnetic fields which couple to the at least one non-linear inductive element of the qubit device.

Example 19 provides the quantum circuit assembly according to any one of the preceding examples, further including a readout resonator, provided either in or out of the qubit plane, configured to detect (readout) a state of the qubit device by capacitively coupling, during operation of the quantum circuit assembly, to a portion of the qubit device.

Example 20 provides the quantum circuit assembly according to any one of the preceding examples, further including a direct drive line, provided either in or out of the qubit plane, configured to set a state of the qubit device by capacitively coupling, during operation of the quantum circuit assembly, to a portion of the qubit device.

Example 21 provides the quantum circuit assembly according to any one of the preceding examples, further including one or more coupling components configured to couple the qubit device to one or more further qubit devices.

Example 22 provides the quantum circuit assembly according to example 21, where the one or more coupling components include one or more coupling resonators.

In some examples, each of one or more of "further qubit devices" of Example provides the quantum circuit assembly according to any one of examples 21-22 may be implemented as the qubit device of Example provides the quantum circuit assembly according to any one of examples 1-20.

Example 23 provides a method of fabricating a quantum circuit assembly, the method including depositing a layer including a electrically conductive, preferably superconductive material over a substrate; patterning the superconductive material to form a first capacitor plate of a capacitor; providing a second capacitor plate of the capacitor, at least a portion of the second capacitor plate being substantially parallel to at least a portion of the first capacitor plate, where a distance between the portion of the second capacitor plate and the portion of the first capacitor plate is between about 20 and 2000 nanometers, including all values and ranges therein, e.g. between about 30 and 1000 nanometers, or between about 40 and 200 nanometers; and providing at least one quantum circuit component coupled to the capacitor.

Example 24 provides the method according to example 23, where the at least one quantum circuit component includes at least one non-linear inductive element (e.g. at least one Josephson Junction) coupled to the capacitor so that the capacitor may serve as a shunt capacitor for the circuit that includes the at least one non-linear inductive element.

Example 25 provides the method according to example 24, where providing the at least one quantum circuit component includes further patterning the superconductive material to form at least a portion of the at least one non-linear inductive element. Thus, in some embodiments, the at least one non-linear inductive element may be provided in the same plane and may be fabricated from the same superconductive material as the first capacitor plate (i.e. the bottom plate) of the capacitor.

Example 26 provides the method according to example 24, where providing the at least one quantum circuit component includes forming the at least one non-linear inductive element over the first capacitor plate.

Example 27 provides the method according to example 26, where providing the second capacitor plate includes providing the second capacitor plate over the at least one non-linear inductive element.

Example 28 provides the method according to examples 26 or 27, where the at least one non-linear inductive element includes a first electrode in physical contact with (and electrically connected to) the first capacitor plate, a second electrode in physical contact with (and electrically connected to) the second capacitor plate, and an insulator layer between the first electrode and the second electrode.

Example 29 provides the method according to any one of examples 24-28, where the at least one non-linear inductive element includes one or more Josephson Junctions.

Example 30 provides the method according to any one of examples 23-29, where the second capacitor plate includes a portion forming a bridge or a cantilever over a portion of the first capacitor plate.

Example 31 provides the method according to any one of examples 23-30, where providing the second capacitor plate includes providing at least one support structure configured to support the portion of the second capacitor plate at least partially over the portion of the first capacitor plate.

Example 32 provides the method according to example 31, where the at least support structure includes a dielectric material.

In various further Examples, the method according to any one of examples 23-32 further includes processes for fabricating the quantum circuit assembly according to any one of the preceding examples (e.g. any one of examples 1-22).

Example 33 provides a quantum IC package, including a qubit die and a further IC element, coupled to the qubit die. The qubit die may include one or more qubit devices, each qubit device including a capacitor, where at least a portion of a first capacitor plate is parallel to each of at least a portion of a second capacitor plate and the qubit die (thus, the capacitor is a parallel-plate capacitor), and is separated from the portion of the second capacitor plate by a gap (which gap may be filled with a fluid or solid dielectric material).

Example 34 provides the quantum IC package according to example 33, where the further IC element is coupled to the qubit die via one or more interconnects between the further IC element and the qubit die.

Example 35 provides the quantum IC package according to examples 33 or 34, where the further IC element is one of an interposer, a circuit board, a flexible board, or a package substrate.

In various further examples, each qubit device of the quantum IC package according to any one of examples 33-35 is implemented as the quantum circuit assembly according to any one of the preceding examples (e.g. examples 1-22).

Example 36 provides a quantum computing device that includes a quantum processing device that includes a plurality of qubit devices provided over a substrate, and a memory device configured to store data generated by the plurality of qubit devices during operation of the quantum processing device. The quantum processing device may include a plurality of qubit devices, each qubit device including a capacitor, where at least a portion of a first capacitor plate is parallel to each of at least a portion of a second capacitor plate and at least a portion of the substrate (thus, the capacitor is a parallel-plate capacitor), and is separated from the portion of the second capacitor plate by a gap (which gap may be filled with a fluid or solid dielectric material).

Example 37 provides the quantum computing device according to example 36, further including a cooling apparatus configured to maintain a temperature of the quantum processing device below 5 degrees Kelvin.

Example 38 provides the quantum computing device according to examples 36 or 37, where the memory device is configured to store instructions for a quantum computing algorithm to be executed by the quantum processing device.

Example 39 provides the quantum computing device according to any one of examples 36-38, further including a non-quantum processing device coupled to the quantum processing device.

In various further examples, at least some of the plurality of qubit devices of the quantum computing device according to any one of examples 36-39 are implemented as the quantum circuit assembly according to any one of the preceding examples (e.g. examples 1-22). In still further examples, the quantum computing device according to any one of examples 36-39 includes the quantum IC package according to any one of the preceding examples (e.g. examples 33-35).

Example 40 provides a quantum IC package that includes a qubit die having at least one qubit device having a parallel-plate vertically-stacked capacitor, and a further IC element, coupled to the qubit die.

Example 41 provides the quantum IC package according to example 40, where the further IC element is coupled to the qubit die via one or more interconnects between the further IC element and the qubit die.

Example 42 provides the quantum IC package according to examples 40 or 41, where the further IC element is one of an interposer, a circuit board, a flexible board, or a package substrate.

In various further examples, the at least one qubit device of the quantum IC package according to any one of examples 40-42 may be implemented as the qubit device of the quantum circuit assembly according to any one of the preceding examples (e.g. examples 1-22).

In various further examples, the at least one qubit device of the quantum IC package according to any one of examples 40-42 may be included in the quantum computing device according to any one of the preceding examples.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum circuit assembly, comprising:
   a qubit device over or at least partially in a substrate, the qubit device comprising a capacitor that includes a first capacitor plate and a second capacitor,
   wherein:
   at least a portion of the second capacitor plate is suspended over at least a portion of the first capacitor plate,
   the qubit device further comprises at least one non-linear inductive element,
   the capacitor is coupled to the at least one non-linear inductive element, and
   the at least one non-linear inductive element is between the first capacitor plate and the second capacitor plate.

2. The quantum circuit assembly according to claim 1, wherein the second capacitor plate includes a portion forming a bridge over a portion of the first capacitor plate.

3. The quantum circuit assembly according to claim 1, further comprising at least one support structure between the first capacitor plate and the second capacitor plate.

4. The quantum circuit assembly according to claim 3, wherein the at least one support structure includes an insulator.

5. The quantum circuit assembly according to claim 1, wherein the first capacitor plate is separated from the second capacitor plate by a dielectric medium, and wherein the dielectric medium is gaseous or vacuum.

6. The quantum circuit assembly according to claim 1, wherein the qubit device is a transmon qubit.

7. The quantum circuit assembly according to claim 1, wherein the at least one non-linear inductive element includes at least one Josephson Junction.

8. The quantum circuit assembly according to claim 1, wherein the at least one non-linear inductive element includes a superconducting quantum interference device (SQUID) comprising two or more Josephson Junctions connected by a superconductor loop.

9. The quantum circuit assembly according to claim 1, wherein the capacitor is coupled to the at least one non-linear inductive element by being connected in electrical parallel to the at least one non-linear inductive element.

10. The quantum circuit assembly according to claim 1, wherein the at least one non-linear inductive element includes a first portion in contact with the first capacitor plate and a second portion in contact with the second capacitor plate.

11. The quantum circuit assembly according to claim 1, wherein:
the at least one non-linear inductive element is a Josephson Junction,
the first portion is a first electrode of the Josephson Junction,
the second portion is a second electrode of the Josephson Junction, and
the first and second electrodes of the Josephson Junction are separated by a tunnel barrier.

12. A method of fabricating a quantum circuit assembly, the method comprising:
depositing a superconductive material over a substrate;
patterning the superconductive material to form a first capacitor plate of a capacitor;
providing a non-linear inductive element;
providing a second capacitor plate of the capacitor so that the non-linear inductive element is between the first capacitor plate and the second capacitor plate; and
providing at least one quantum circuit component coupled to the capacitor.

13. The method according to claim 12, wherein the non-linear inductive element includes at least one Josephson Junction.

14. A quantum computing device, comprising:
a quantum processing device that includes a plurality of qubit devices, each qubit device comprising a capacitor having a first capacitor plate, a second capacitor plate, and a non-linear inductive element between the first capacitor plate and the second capacitor plate; and
a memory device configured to store data generated by the plurality of qubit devices during operation of the quantum processing device.

15. The quantum computing device according to claim 14, wherein at least a portion of the second capacitor plate is suspended over at least a portion of the first capacitor plate.

16. The quantum circuit assembly according to claim 3, wherein the at least one non-linear inductive element is in the at least one support structure.

17. The method according to claim 12, wherein at least a portion of the second capacitor plate is suspended over at least a portion of the first capacitor plate.

18. The quantum circuit assembly according to claim 1, further comprising at least two support structures between the first capacitor plate and the second capacitor plate.

19. The quantum circuit assembly according to claim 1, wherein the quantum circuit assembly is, or is included in, a quantum integrated circuit (IC) package that includes a further IC element coupled to the qubit device.

20. The quantum circuit assembly according to claim 19, wherein the further IC element is one of an interposer, a circuit board, a flexible board, or a package substrate.

21. The quantum computing device according to claim 14, wherein the at least one non-linear inductive element includes at least one Josephson Junction.

22. The quantum computing device according to claim 14, wherein at least one of the plurality of qubit devices further includes at least two support structures between the first capacitor plate and the second capacitor plate of the at least one of the plurality of qubit devices.

23. A quantum circuit assembly, comprising:
a qubit device;
a capacitor, coupled to or included in the qubit device, the capacitor including a first capacitor plate and a second capacitor plate; and
at least two support structures between the first capacitor plate and the second capacitor plate,
wherein the second capacitor plate includes a portion forming a bridge over at least a portion of the first capacitor plate.

24. The quantum circuit assembly according to claim 23, wherein the portion of the second capacitor plate forms the bridge over the portion of the first capacitor plate by being supported over the portion of the first capacitor plate by the at least two support structures.

* * * * *

UNITED STATES PATENT AND TRADEMARK OFFICE
CERTIFICATE OF CORRECTION

Page 1 of 1

PATENT NO. : 10,665,769 B2
APPLICATION NO. : 16/011829
DATED : May 26, 2020
INVENTOR(S) : Roman Caudillo et al.

It is certified that error appears in the above-identified patent and that said Letters Patent is hereby corrected as shown below:

On the Title Page

In Column 2, item (74) under "Attorney, Agent, or Firm", Line 1, delete "Patnet" and insert -- Patent --, therefor.

Signed and Sealed this
Fourth Day of August, 2020

Andrei Iancu
*Director of the United States Patent and Trademark Office*